(12) United States Patent
Il et al.

(10) Patent No.: US 9,948,275 B2
(45) Date of Patent: Apr. 17, 2018

(54) PIEZOELECTRIC VIBRATION ELEMENT, PIEZOELECTRIC VIBRATOR, PIEZOELECTRIC OSCILLATOR, AND ELECTRONIC DEVICE

(71) Applicant: SEIKO EPSON CORPORATION, Tokyo (JP)

(72) Inventors: Toshihiro Il, Kamiina-gun (JP); Matsutaro Naito, Kamiina-gun (JP)

(73) Assignee: SEIKO EPSON CORPORATION, Tokyo (JP)

( * ) Notice: Subject to any disclaimer, the term of this patent is extended or adjusted under 35 U.S.C. 154(b) by 468 days.

(21) Appl. No.: 14/683,891

(22) Filed: Apr. 10, 2015

(65) Prior Publication Data
US 2015/0214922 A1    Jul. 30, 2015

Related U.S. Application Data

(60) Continuation of application No. 14/012,338, filed on Aug. 28, 2013, now Pat. No. 9,093,634, which is a
(Continued)

(30) Foreign Application Priority Data
Mar. 18, 2011    (JP) ................. 2011-060457

(51) Int. Cl.
*H01L 41/09*    (2006.01)
*H03H 9/19*    (2006.01)
(Continued)

(52) U.S. Cl.
CPC ............ *H03H 9/19* (2013.01); *H01L 41/047* (2013.01); *H03B 5/36* (2013.01); *H03H 9/0542* (2013.01);
(Continued)

(58) Field of Classification Search
CPC ........ H03H 9/19; H03H 9/177; H01L 41/047; H03B 5/36
(Continued)

(56) References Cited

U.S. PATENT DOCUMENTS 5,198,716 A * 3/1993 Godshall .............. H03H 9/1035
310/344
6,191,524 B1 2/2001 Sasaki et al.
(Continued)

FOREIGN PATENT DOCUMENTS

EP    1780890 A2    5/2007
JP    S58-047316 A    3/1983
(Continued)

OTHER PUBLICATIONS

Jun. 18, 2013 Office Action issued in U.S. Appl. No. 13/420,061.
(Continued)

*Primary Examiner* — Thomas Dougherty
(74) *Attorney, Agent, or Firm* — Oliff PLC

(57) ABSTRACT

A piezoelectric vibration element includes a piezoelectric substrate including (i) an excitation portion and (ii) a peripheral portion that is integrally arranged at a periphery of the excitation portion and whose thickness is smaller than that of the excitation portion. The piezoelectric vibration element further includes excitation electrodes that are arranged in a front-and-rear relationship on front and rear principal faces of the piezoelectric substrate. The excitation portion includes a first portion that is at a location of a maximum thickness of the excitation portion and a side face that is connected to (i) a principal face of the first portion and (ii) a principal face of the peripheral portion. The side face includes level difference portions having a level difference
(Continued)

and a face that has no level difference from the principal face of the first portion to the principal face of the peripheral portion.

19 Claims, 13 Drawing Sheets

Related U.S. Application Data division of application No. 13/420,061, filed on Mar. 14, 2012, now Pat. No. 8,614,607.

(51) Int. Cl.
| | | |
|---|---|---|
| *H03H 9/17* | (2006.01) | |
| *H01L 41/047* | (2006.01) | |
| *H03B 5/36* | (2006.01) | |
| *H03H 9/05* | (2006.01) | |
| *H03H 9/10* | (2006.01) | |

(52) U.S. Cl.
CPC ........ *H03H 9/0552* (2013.01); *H03H 9/1021* (2013.01); *H03H 9/177* (2013.01)

(58) Field of Classification Search
USPC .................. 310/340, 344, 348, 365, 367
See application file for complete search history.

(56) References Cited

U.S. PATENT DOCUMENTS

| | | | |
|---|---|---|---|
| 6,518,688 | B1 | 2/2003 | Sasaki |
| 7,388,454 | B2 | 6/2008 | Ruby et al. |
| 7,518,294 | B2 | 4/2009 | Umetsu |
| 7,535,154 | B2 | 5/2009 | Umeda et al. |
| 7,608,986 | B2 | 10/2009 | Yong et al. |
| 8,450,906 | B2 | 5/2013 | Taniguchi et al. |
| 8,536,761 | B2 | 9/2013 | Yamashita et al. |
| 8,614,607 | B2 | 12/2013 | Il et al. |
| 8,638,022 | B2 | 1/2014 | Yamashita et al. |
| 8,766,514 | B2 * | 7/2014 | Il .............................. H03H 3/02 310/320 |
| 9,030,078 | B2 * | 5/2015 | Il .............................. H03H 3/02 310/333 |
| 9,093,634 | B2 * | 7/2015 | Il ............................. H03H 9/177 |
| 9,231,183 | B2 | 1/2016 | Naito et al. |
| 9,431,995 | B2 * | 8/2016 | Yamashita ............... H03H 9/19 |
| 9,496,480 | B2 * | 11/2016 | Naito .................. H01L 41/0825 |
| 9,503,045 | B2 * | 11/2016 | Naito ..................... H03H 9/171 |
| 2003/0111935 | A1 | 6/2003 | Akane et al. |
| 2004/0095044 | A1 | 5/2004 | Yagishita |
| 2005/0258146 | A1 | 11/2005 | Umetsu |
| 2007/0008829 | A1 | 1/2007 | Kitahara et al. |
| 2007/0096596 | A1 | 5/2007 | Naito et al. |
| 2010/0148637 | A1 | 6/2010 | Satou |
| 2010/0277251 | A1 | 11/2010 | Kondo |
| 2011/0203083 | A1 | 8/2011 | Sasaki et al. |
| 2012/0056514 | A1 * | 3/2012 | Ishikawa ............ H03H 9/02157 310/344 |
| 2012/0126668 | A1 | 5/2012 | Il et al. |
| 2012/0178648 | A1 | 7/2012 | Kawase et al. |
| 2012/0235762 | A1 | 9/2012 | Il et al. |
| 2013/0032842 | A1 | 2/2013 | Park et al. |
| 2013/0063002 | A1 * | 3/2013 | Mizusawa ............ H03H 9/0595 310/365 |
| 2013/0106247 | A1 * | 5/2013 | Ariji ........................ H03H 9/02 310/348 |
| 2013/0106249 | A1 | 5/2013 | Ariji et al. |
| 2013/0193807 | A1 | 8/2013 | Mizusawa |
| 2013/0249353 | A1 * | 9/2013 | Naito .................. H01L 41/0825 310/367 |
| 2013/0328452 | A1 | 12/2013 | Fujihara et al. |
| 2014/0139074 | A1 | 5/2014 | Naito et al. |
| 2016/0032367 | A1 | 2/2016 | Kawase et al. |

FOREIGN PATENT DOCUMENTS

| | | |
|---|---|---|
| JP | S58-45205 B2 | 10/1983 |
| JP | H02-57009 A | 2/1990 |
| JP | 06-052230 U | 7/1994 |
| JP | H10-308645 A | 11/1998 |
| JP | H11-355094 A | 12/1999 |
| JP | 2001-077647 A | 3/2001 |
| JP | 2001-230654 A | 8/2001 |
| JP | 2001-230655 A | 8/2001 |
| JP | 2004-200777 A | 7/2004 |
| JP | 2005-159717 A | 6/2005 |
| JP | 2005-318477 A | 11/2005 |
| JP | 2006-014270 A | 1/2006 |
| JP | 3731348 B2 | 1/2006 |
| JP | 2006-108949 A | 4/2006 |
| JP | 2007-037394 A | 2/2007 |
| JP | 2007-124441 A | 5/2007 |
| JP | 2007-189492 A | 7/2007 |
| JP | 4075893 B2 | 4/2008 |
| JP | 2008-236439 A | 10/2008 |
| JP | 2008-263387 A | 10/2008 |
| JP | 2008-306594 A | 12/2008 |
| JP | 2009-065270 A | 3/2009 |
| JP | 2009-130543 A | 6/2009 |
| JP | 2009-130564 A | 6/2009 |
| JP | 4341583 B2 | 10/2009 |
| JP | 4341671 B2 | 10/2009 |
| JP | 2010-062723 A | 3/2010 |
| JP | 2010-109527 A | 5/2010 |
| JP | 2010-114620 A | 5/2010 |
| JP | 4506135 B2 | 7/2010 |
| JP | 4558433 B2 | 10/2010 |
| JP | 4572807 B2 | 11/2010 |
| JP | 2012-054796 A | 3/2012 |
| JP | 2012-114496 A | 6/2012 |
| JP | 2012-199602 A | 10/2012 |
| JP | 2013-098813 A | 5/2013 |
| JP | 2013-098814 A | 5/2013 |
| JP | 2013-141311 A | 7/2013 |
| JP | 2013-192044 A | 9/2013 |
| JP | 2013-197913 A | 9/2013 |
| JP | 2014-080050 A | 5/2014 |
| JP | 2014-147091 A | 8/2014 |
| JP | 2015-091240 A | 5/2015 |

OTHER PUBLICATIONS

Goka; A Study on Improvement of Properties of AT-Cut Quartz Resonator Having Mesa Structure; Tokyo Metropolitan University; 2005.
Goka et al.; "Decoupling Effect of Stepped Mesa Structures on Spurious Vibrations of AT-Cut Quartz Plates;" International Frequency Control Symposium and Exhibition; 2000; pp. 397-400.
Goka et al.; "Mode Decoupling Effect of Multistepped Bi-Mesa AT-Cut Quartz Resonators;" Japanese Journal of Applied Physics; 2004; pp. 3016-3019; vol. 43, No. 5B.
Shen et al.; "Energy Trapping in Mesa-Shaped Quartz Crystal Microbalance;" Proceedings of IEEE Sensors; 2002; pp. 1154-1159; vol. 2.
Mar. 3, 2012 Search Report issued in European Patent Application No. 11189519.9.
Apr. 21, 2017 Office Action issued in U.S Appl. No. 14/682,466.
Jan. 11, 2017 Office Action Issued in U.S Appl. No. 14/682,466.

* cited by examiner

CROSS-SECTIONAL VIEW
TAKEN ALONG LINE P1-P1

ELECTRODE AREA  S=Le×W

CROSS-SECTIONAL VIEW TAKEN ALONG LINE P1-P1

PIEZOELECTRIC VIBRATION ELEMENT, PIEZOELECTRIC VIBRATOR, PIEZOELECTRIC OSCILLATOR, AND ELECTRONIC DEVICE

REFERENCE TO CO-PENDING APPLICATIONS

This application is a Continuation of application Ser. No. 14/012,338 filed Aug. 28, 2013, which in turn is a Divisional of application Ser. No. 13/420,061 filed Mar. 14, 2012, now issued as U.S. Pat. No. 8,614,607, which claims priority to Japanese Patent Application JP 2011-060457 filed Mar. 18, 2011. The disclosures of the prior applications are hereby incorporated by reference herein in their entirety.

BACKGROUND

1. Technical Field

The present invention relates to a piezoelectric vibrator of a thickness vibration mode, and more particularly, to a piezoelectric vibration element, a piezoelectric vibrator, a piezoelectric oscillator, and an electronic device having so-called a mesa structure.

2. Related Art

AT cut quartz crystal vibrators have a thickness-shear vibration as its vibration mode and are appropriate for miniaturization and the implementation of a high frequency, and the frequency-temperature characteristic thereof represents a superior cubic curve. Accordingly, the AT cut quartz crystal vibrators are widely used for electronic apparatuses and a variety of other uses.

In JP-B-58-045205, so-called a piezoelectric vibrator having a mesa structure, which has an energy trapping effect similarly to a beveled structure or a convex structure, is disclosed, and a piezoelectric substrate having a circular shape and a circular mesa structure is disclosed.

In JP-A-58-047316, in addition to a piezoelectric substrate having a circular shape and a circular mesa structure, a piezoelectric substrate having a strip-shaped mesa structure is disclosed.

As the sizes of the electronic apparatuses tend to decrease, a vibrator having a low side ratio (the ratio of a longer side or a shorter side to the thickness) has been requested. In a vibrator having a low side ratio, a contour vibration may be easily combined with its main vibration, and accordingly, the electrical characteristics of the main vibration deteriorate.

In JP-UM-A-06-052230, an AT cut quartz crystal vibrator is formed so as to employ a mesa structure, and a problem is handled in which a drawn-out electrode (lead electrode) extending from an excitation electrode may be broken in case where the side wall of a boundary portion between a mesa portion and a thin-walled portion forms 90° with respect to the principal face, and it is disclosed that the breaking of the lead electrode can be prevented by forming the side wall of the boundary portion to be tilted or a curved face. In addition, it is disclosed that, by decreasing the roughness of the surface of the vibration portion to average roughness of 0.2 micron, the CI value decreases, and secondary vibration is suppressed.

In addition, in JP-A-2001-230655, a quartz crystal vibrator is disclosed in which an AT cut quartz crystal vibrator is formed so as to employ a mesa structure, and the side walls of a mesa portion are tilted to 63° and 35°, thereby suppressing a combination of thickness-shear vibration and bending vibration.

In Japanese Patent No. 4,341,583, it is disclosed that, when the frequency of a quartz crystal vibration element is f, the length of the longer side (X axis) of a quartz crystal substrate is X, the thickness of a mesa portion (vibration portion) is t, the length of the longer side of the mesa portion is Mx, the length of the longer side of an excitation electrode is Ex, and the wavelength of bending vibration occurring in the longer side direction of the quartz crystal substrate is λ, by setting the parameters f, X, Mx, and Ex so as to satisfy the following four equations, a combination of thickness-shear vibration and bending vibration can be suppressed.

$$\lambda/2=(1.332/f)-0.0024 \tag{1}$$

$$(Mx-Ex)/2=\lambda/2 \tag{2}$$

$$Mx/2=(n/2+1/4)\lambda \text{ (here, } n \text{ is an integer)} \tag{3}$$

$$X \geq 20t \tag{4}$$

In addition, in Japanese Patent No. 4,341,671, it is disclosed that a bending displacement component decreases in a case where the positions of the end edge of a vibration portion and the end edge portion of an excitation electrode are set so as to coincide with the position of the antinode of the bending displacement, whereby the bending vibration as an unnecessary mode can be suppressed.

In JP-A-2008-306594, a mesa-type vibration element that improves the frequency variable sensitivity and suppresses unnecessary vibration is proposed. Generally, in a vibration element, as an excitation electrode is formed to be larger, the equivalent series capacitance C1 increases, whereby the frequency variable sensitivity can be increased. It is disclosed that a mesa-type vibration element in which the excitation electrode is formed to be large can be easily oscillated, and the width of the frequency change with respect to load capacitance can be broadened.

In JP-A-2009-065270, it is disclosed that, when the longer side of a piezoelectric substrate is in the X axis direction, the shorter side thereof is in the Z' axis direction, the longer side of a mesa portion is in the X axis direction, and the shorter side (length MZ) thereof is in the Z' axis direction in a mesa-type vibration element, both end portions of one shorter side of the mesa portion are chamfered, and the length thereof is M1, by satisfying the relationship of M1≥Mz/4, bending vibration can be suppressed.

In JP-A-2009-130543, an AT cut quartz crystal vibrator having a mesa structure is disclosed. When the positions of both end portions of a mesa portion along the X axis direction are A and D, and the positions of excitation electrodes formed on the mesa portion are B and C, the relationship of A<B<C<D is configured to be satisfied. The positions of the end edges A, B, C, and D and the position of the antinode of bending vibration are configured to coincide with each other. The amplitude of the antinode of bending vibration that is located at the position A and the amplitude of the antinode of bending vibration that is located at the position B are in opposite directions. In addition, the amplitude of the antinode of bending vibration that is located at the position B and the amplitude of the antinode of bending vibration that is located at the position C are in opposite directions. Furthermore, the amplitude of the antinode of bending vibration that is located at the position C and the amplitude of the antinode of bending vibration that is located at the position D are in opposite directions. In other words, when the wavelength of the bending vibration is X, in the end edges adjacent to each other, there is misalignment of the antinode of the bending vibration of odd times $\lambda/2$. It is disclosed that, when the length of the mesa portion is ML and the wavelength of the bending vibration occurring in the X axis direction is $\lambda$, by configuring ML and $\lambda$ so as to satisfy the relationship of ML=(n−1/2)$\lambda$, the bending vibration occurring in the mesa-type vibration element can be suppressed, and the CI can be decreased.

There is a problem in that the capacitance ratio $\gamma$ (the ratio C0/C1 of electrostatic capacitance C0 to the equivalent serial capacitance C1) of the piezoelectric vibration element employing the mesa structure is relatively high (deteriorates), compared to those of the piezoelectric vibration element employing the beveled structure or the convex structure. In Japanese Patent No. 4,506,135, a piezoelectric vibration element is disclosed in which an excitation electrode is broadened toward the end face of the piezoelectric substrate more than the level difference portion of the mesa portion. By changing the area of the excitation electrode of the portion enlarged toward the outer side more than the level difference portion of the mesa portion, the capacitance ratio of the piezoelectric vibration element can be arbitrarily set. As a result, it is disclosed that a piezoelectric vibration element employing a mesa structure that has performance equivalent to a piezoelectric vibration element employing the beveled structure or the convex structure can be realized.

In Japanese Patent No. 4,558,433, a piezoelectric vibration element is disclosed which suppresses variations of the oscillation frequency due to a change in the load capacitance CL by increasing the capacitance ratio $\gamma$ of the fundamental wave vibration. Generally, the capacitance ratio $\gamma$ is configured to be low by configuring the area of the excitation electrode near a saturation point of the equivalent serial capacitance C1. However, by further broadening the area of the excitation electrode passing the saturation point, while a change in the equivalent serial capacitance C1 is small, the electrostatic capacitance C0 increases in proportional to the area. Accordingly, it is disclosed that the capacitance ratio $\gamma$ can be increased.

In JP-A-2001-230654, a piezoelectric vibrator is disclosed in which excitation electrodes are disposed on the front and rear faces of a narrow band-shaped (strip-shaped) piezoelectric substrate at the center portion, and lead electrodes extend from the excitation electrodes toward end portions located on the opposite sides. The substrate of the face on which the lead electrode is not formed is ground so as to form a pseudo mesa-type structure. Since this piezoelectric vibrator can trap the vibration energy under the excitation electrode, it is disclosed that the CI is low, and it is difficult for breaking of the lead electrode to occur.

In JP-A-2010-062723, it is disclosed that, when the length of the shorter side of a piezoelectric substrate employing a mesa structure is Z, the thickness of a mesa portion (vibration portion) is t, and the dimension of the electrode in the shorter side direction of the mesa portion is Mz, by setting parameters so as to satisfy the relationship of $15.68 \leq Z/t \leq 15.84$ and $0.77 \leq Mz/Z \leq 0.82$, an unnecessary mode can be suppressed.

In Japanese Patent No. 4,572,807, a mesa-type piezoelectric vibration element is disclosed. It is disclosed that, when the length of the longer side of a quartz crystal substrate is x, the canal amount (the height of a mesa portion) of the level difference portion is Md, the plate thickness of the vibration portion is t, and the ratio of the canal amount Md of the level difference portion to the plate thickness t is y (percentage), by configuring the ratio y to satisfy the relationship of $y=-1.32\times(x/t)+42.87$ and $y \leq 30$ and the ratio of the length x of the longer side to the plate thickness of the vibration portion of the quartz crystal substrate, that is, the side ratio x/t to be equal to or less than 30, the electrical characteristics of the piezoelectric vibration element do not deteriorate, and the CI can be decreased.

In JP-A-2008-263387, it is disclosed that, when the dimension of the longer side of a piezoelectric substrate is x, the thickness dimension of a mesa portion (vibration portion) is t, and the height (canal amount of the level difference portion) of the mesa portion of the piezoelectric substrate employing a mesa structure is y, by setting the side ratio x/t so as to satisfy "$y=-0.89\times(x/t)+34\pm3(\%)$" with reference to the plate thickness t, an unnecessary mode can be suppressed.

However, recently, the miniaturization of a piezoelectric vibrator so as to configure the container size to be about 1.6 mm×1.2 mm is requested from customers. The X side ratio (the ratio X/t of the longer side X to the thickness t) of an AT cut quartz crystal vibrator element employing a mesa structure that is mounted in such a small container, for example, is equal to or less than 1100 (µm)/65 (µm)=17. Even by applying the above-described techniques to such as small-size piezoelectric vibrator, there is a problem in that the CI (crystal impedance, equivalent resistance R1) requested from the customers cannot be acquired.

SUMMARY

An advantage of some aspects of the invention is that it provides a mesa-type piezoelectric vibration element of a thickness-shear vibration mode, which has a low X side ratio and low CI, having the longer side in the X axis direction.

Application Example 1

This application example of the invention is directed to a piezoelectric vibration element including: a piezoelectric substrate; excitation electrodes that are arranged so as to face each other on both principal faces of the piezoelectric substrate; drawn-out electrodes that extend from the excitation electrodes toward one end portion of the piezoelectric substrate; and pads that are electrically connected to the drawn-out electrodes and are formed on two corner portions of the piezoelectric substrate. The piezoelectric substrate includes an excitation portion that is located at the center and a peripheral portion that is thin-walled to be thinner than the thickness of the excitation portion and is disposed on a peripheral edge of the excitation portion, and two side faces of the excitation portion that face each other are planes having no level difference, and the other two side faces of the excitation portion that face each other have level difference portions in a thickness direction. In addition, support areas that fix the piezoelectric substrate to a support member are included at positions of the piezoelectric substrate corresponding to the pads of the corner portions, and the excitation electrodes are formed over the excitation portion and a vibration area that is at least apart of the peripheral portion.

As above, a piezoelectric vibration element is configured in which the excitation electrode is disposed in the excitation portion employing a mesa structure having a level difference portion in the thickness direction along one direction and a part of the peripheral portion connected to the peripheral edge of the excitation portion. Although the vibration energy is mainly trapped in the excitation portion, the electric charge generated when the piezoelectric vibration element is excited is efficiently collected by the excitation electrode disposed in a part of the peripheral portion. As a result, there are advantages that a piezoelectric vibration element having low CI can be acquired, and a piezoelectric vibration element in which an unnecessary mode such as bending is small can be acquired.

Application Example 2

This application example of the invention is directed to a piezoelectric vibration element including: a piezoelectric substrate; excitation electrodes that are arranged so as to face each other on both principal faces of the piezoelectric substrate; drawn-out electrodes that extend from the excitation electrodes toward one end portion of the piezoelectric substrate; and pads that are electrically connected to the drawn-out electrodes and are formed on two corner portions of the piezoelectric substrate. The piezoelectric substrate includes an excitation portion that is located at the center and a peripheral portion that is thin-walled to be thinner than the thickness of the excitation portion and is disposed on a peripheral edge of the excitation portion, and all the side faces of the excitation portion have level difference portions in a thickness direction. In addition, support areas that fix the piezoelectric substrate to a support member are included at positions of the piezoelectric substrate corresponding to the pads of the corner portions, and the excitation electrodes are formed over the excitation portion and a vibration area that is at least apart of the peripheral portion.

As above, a piezoelectric vibration element is configured in which the excitation electrode is disposed in the excitation portion employing a mesa structure having level difference portions on all the side faces and a part of the peripheral portion connected to the peripheral edge of the excitation portion. Although the vibration energy is mainly trapped in the excitation portion, the electric charge generated when the piezoelectric vibration element is excited is efficiently collected by the excitation electrode disposed in a part of the peripheral portion. As a result, there are advantages that a piezoelectric vibration element having low CI can be acquired, and a piezoelectric vibration element in which an unnecessary mode such as bending is small can be acquired.

Application Example 3

This application example of the invention is directed to the piezoelectric vibration element according to Application Example 1, wherein, when, by using an X axis of an orthogonal coordinate system formed from the X axis as an electrical axis, a Y axis as a mechanical axis, and a Z axis as an optical axis, which are crystal axes of a crystal, as the center, an axis acquired by inclining the Z axis in a −Y direction of the Y axis is set as a Z' axis and an axis acquired by inclining the Y axis in a +Z direction of the Z axis is set as a Y' axis, the piezoelectric substrate is a quartz crystal substrate that is configured by faces that are parallel to the X axis and the Z' axis and has a thickness in a direction parallel to the Y' axis, the quartz crystal substrate has a side parallel to the X axis as a longer side and a side parallel to the Z' axis as a shorter side and includes an excitation portion that is located at the center and a peripheral portion that is thin-walled to be thinner than the thickness of the excitation portion and is disposed on a peripheral edge of the excitation portion, and two side faces of the excitation portion that are parallel to the X axis are planes having no level difference, and the other two side faces of the excitation portion that are parallel to the Z' axis have level difference portions in the thickness direction.

As above, a piezoelectric vibration element is configured in which the excitation electrode is disposed in the excitation portion having level difference portions on two side faces parallel to the Z' axis in the thickness directions and apart of the peripheral portion connected to the peripheral edge of the excitation portion. Although the vibration energy is mainly trapped in the excitation portion, the electric charge generated when the piezoelectric vibration element is excited is efficiently collected by the excitation electrode disposed in a part of the peripheral portion. As a result, there are advantages that a piezoelectric vibration element having low CI can be acquired, and a piezoelectric vibration element in which an unnecessary mode such as bending is small can be acquired.

Application Example 4

This application example of the invention is directed to the piezoelectric vibration element according to Application Example 2, wherein, when, by using an X axis of an orthogonal coordinate system formed from the X axis as an electrical axis, a Y axis as a mechanical axis, and a Z axis as an optical axis, which are crystal axes of a crystal, as the center, an axis acquired by inclining the Z axis in a −Y direction of the Y axis is set as a Z' axis and an axis acquired by inclining the Y axis in a +Z direction of the Z axis is set as a Y' axis, the piezoelectric substrate is a quartz crystal substrate that is configured by faces that are parallel to the X axis and the Z' axis and has a thickness in a direction parallel to the Y' axis, the quartz crystal substrate has a side parallel to the X axis as a longer side and a side parallel to the Z' axis as a shorter side and includes an excitation portion that is located at the center and a peripheral portion that is thin-walled to be thinner than the thickness of the excitation portion and is disposed on a peripheral edge of the excitation portion, and two side faces of the excitation portion that are parallel to the X axis and two side faces of the excitation portion that are parallel to the Z' axis have level difference portions in the thickness direction.

As above, a piezoelectric vibration element is configured in which the excitation electrode is disposed in the excitation portion having level difference portions on two side faces parallel to the X axis and two side faces parallel to the Z' axis in the thickness directions and a part of the peripheral portion connected to the peripheral edge of the excitation portion. Although the vibration energy is mainly trapped in the excitation portion, the electric charge generated when the piezoelectric vibration element is excited is efficiently collected by the excitation electrode disposed in a part of the peripheral portion. As a result, there are advantages that a piezoelectric vibration element having low CI can be acquired, and a piezoelectric vibration element in which an unnecessary mode such as bending is small can be acquired.

Application Example 5

This application example of the invention is directed to the piezoelectric vibration element according to Application Example 3 or 4, wherein, when a dimension of the piezoelectric substrate in a direction parallel to the X axis is X, a thickness of the excitation portion is t, and a distance between an end portion of the support area and an end portion of the excitation electrode, which face each other, is $\Delta X$, relationship of $14 \leq X/t \leq 18$ and $0.04 \text{ mm} \leq \Delta X \leq 0.06 \text{ mm}$ is satisfied.

In a case where the piezoelectric vibration element is configured as above, there is an advantage that a piezoelectric vibration element having low CI can be acquired.

Application Example 6

This application example of the invention is directed to the piezoelectric vibration element according to Application Example 3 or 4, wherein, when a dimension of the piezoelectric substrate in a direction parallel to the Z' axis is Z, a dimension of a shorter side of the excitation portion is Mz and a thickness of the excitation portion is t, relationship of $8 \leq Z/t \leq 11$ and $0.6 \leq Mz/Z \leq 0.8$ is satisfied.

In a case where the piezoelectric vibration element is configured as above, there are advantages that a piezoelectric vibration element having low CI can be acquired, and a piezoelectric vibration element in which there is no combination with an unnecessary mode such as bending vibration can be acquired.

Application Example 7

This application example of the invention is directed to a piezoelectric vibrator including: the piezoelectric vibration element according to any one of Application Examples 1 to 6; and a package that houses the piezoelectric vibration element.

In a case where the piezoelectric vibrator is configured as above, since it includes the above-described piezoelectric vibration element, there is an advantage that a piezoelectric vibrator having low CI can be acquired.

Application Example 8

This application example of the invention is directed to a piezoelectric oscillator including: the piezoelectric vibration element according to any one of Application Examples 1 to 6; an oscillation circuit that drives the piezoelectric vibration element; and an insulating substrate.

As above, since the above-described piezoelectric vibration element having low CI and the oscillation circuit are mounted on the insulating substrate, and the piezoelectric oscillator in which a space on the insulating substrate is sealed in an airtight manner is configured, there are advantages that the miniaturization is achieved, and an oscillation current can be lowered, thereby achieving low power consumption.

Application Example 9

This application example of the invention is directed to a piezoelectric oscillator including: the piezoelectric vibrator according to Application Example 7; and an oscillation circuit that drives the piezoelectric vibrator.

In a case where the piezoelectric oscillator is configured as above, since the above-described piezoelectric vibrator having low CI is included, the oscillation frequency is stabilized, and a current in the oscillation circuit can be lowered, whereby there is an advantage that the power consumption of the piezoelectric oscillator can be decreased.

Application Example 10

This application example of the invention is directed to the piezoelectric oscillator according to Application Example 8 or 9, wherein the oscillation circuit is mounted in an IC.

In a case where the piezoelectric oscillator is configured as above, since the oscillation circuit is formed as an IC, there are advantages that the piezoelectric oscillator is miniaturized, and the reliability is improved.

Application Example 11

This application example of the invention is directed to an electronic device that includes the piezoelectric vibration element according to any one of Application Examples 1 to 6 and at least one or more electronic components in a package.

Since the electronic device is configured by the above-described piezoelectric vibration element and the electronic component as above, the electronic device including the piezoelectric vibration element having low CI can be configured, and accordingly, there is an advantage that the electronic device can be used for a variety of uses.

Application Example 12

This application example of the invention is directed to the electronic device according to Application Example 11, wherein the electronic component is one of a thermistor, a capacitor, a reactance element, and a semiconductor element.

By configuring the electronic device by using at least one electronic component out of a thermistor, a capacitor, a reactance element, and a semiconductor element and the piezoelectric vibration element, there is an advantage that a useful device for configuring an electronic device can be acquired.

BRIEF DESCRIPTION OF THE DRAWINGS

The invention will be described with reference to the accompanying drawings, wherein like numbers reference like elements.

FIG. 1A is a plan view, and FIG. 1B is a cross-sectional view taken along line P1-P1 shown in FIG. 1A.

FIG. 11A is a plan view, and FIG. 11B is a cross-sectional view taken along line P1-P1 shown in FIG. 11A.

FIG. 15A is a plan view, and FIG. 15B is a cross-sectional view taken along line P1-P1 shown in FIG. 15A.

DESCRIPTION OF EXEMPLARY EMBODIMENTS

Hereinafter, embodiments of the invention will be described with reference to the drawings. The invention is not limited to the embodiments described below at all and includes various modified examples within the scope not departing from the concept of the invention. In addition, it cannot be determined that all the configurations described in the following embodiments are essential constituent elements of the invention.

1. Piezoelectric Vibration Element

Figure 1A:
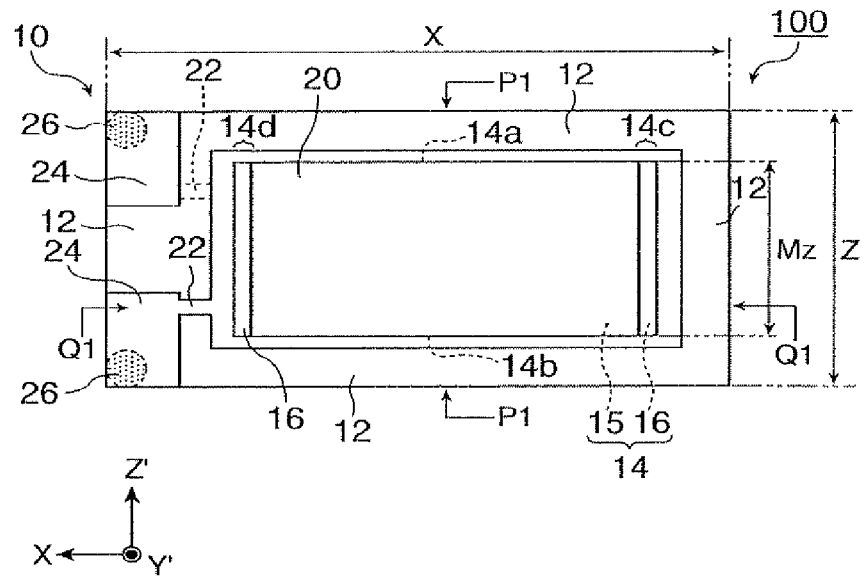
FIGS. 1A and 1B are schematic diagrams showing the configuration of a piezoelectric vibration element having a mesa structure according to an embodiment of the invention.
Figure 1B:
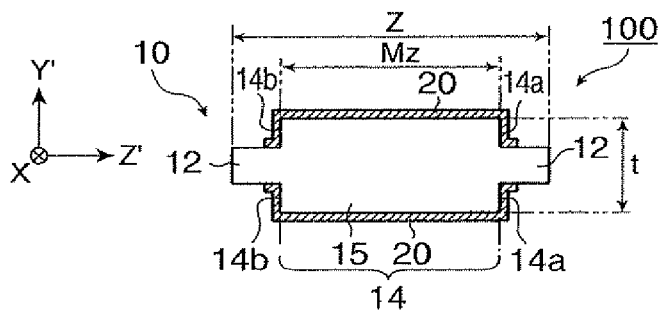
Figure 2:
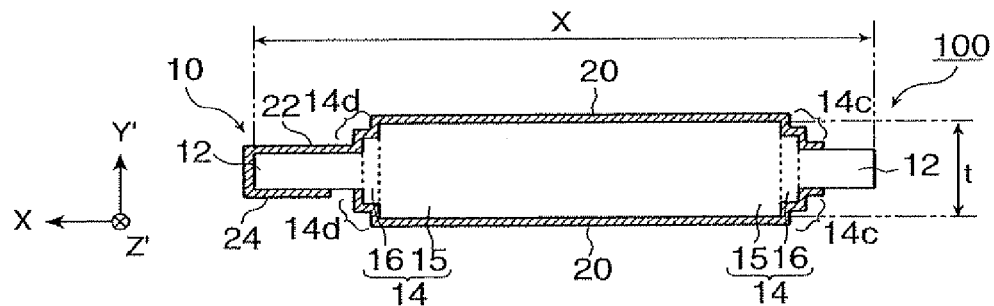
FIG. 2 is a cross-sectional view taken along line Q1-Q1 shown in FIG. 1A.

First, a piezoelectric vibration element according to this embodiment will be described with reference to the drawings. FIGS. 1A, 1B, and 2 are schematic diagrams showing the configuration of the piezoelectric vibration element 100 according to this embodiment of the invention. FIG. 1A is a plan view of the piezoelectric vibration element 100, and FIG. 1B is a cross-sectional view taken along line P1-P1 shown in FIG. 1A. FIG. 2 is a cross-sectional view taken along line Q1-Q1 shown in FIG. 1A.

The piezoelectric vibration element 100 according to the embodiment of the invention mainly includes: a piezoelectric substrate 10 that includes an excitation portion 14 that is located at the center and has a multi-level mesa structure; and a thin-walled peripheral portion 12 that is continuously formed on both peripheral edges of the excitation portion 14; excitation electrodes 20 that are formed from conductive films arranged so as to face each other in the entire areas of both principal faces of the excitation portion 14 and in at least a part of the peripheral portion 12 that is connected to the excitation portion 14; drawn-out electrodes 22 that extend from the excitation electrodes 20 toward one end edge of the piezoelectric substrate 10; pads 24 that are formed in the end portions of the drawn-out electrodes 22 and in two corner portions of the piezoelectric substrate 10; and support areas 26 that is disposed in each corner portion (within the area of the pad) of the piezoelectric substrate forming the pads 24 and fixes the piezoelectric substrate to a support member.

The excitation portion 14 is a thick portion that is formed by protruding the center portion of the piezoelectric substrate in a rectangular shape in both the principal face directions, and the peripheral portion 12 is formed so as to longitudinally protrude from a center portion of at least a part of the outer peripheral side face of the excitation portion in the thickness direction toward the outer diameter direction.

The piezoelectric substrate 10 includes: the excitation portion 14 that is located at the center and is a main vibration area and the peripheral portion 12 that is thin walled thinner than the excitation portion, is formed along the peripheral edge of the excitation portion 14, and is a secondary vibration area. In other words, the vibration area, to be described later, extends over the excitation portion 14 and a part of the peripheral portion 12.

Each of two side faces (both side faces along the longitudinal direction), which face each other, of the excitation portion 14 having an almost rectangular plane shape is one plane having no level difference, and each of the other two side faces (two side faces along the short side direction), which face each other, of the excitation portion 14 has a structure having a level difference portion in the thickness direction. When an AC voltage is applied to each excitation electrode 20, the piezoelectric vibration element 100 is excited at an inherent vibration frequency.

Figure 3:
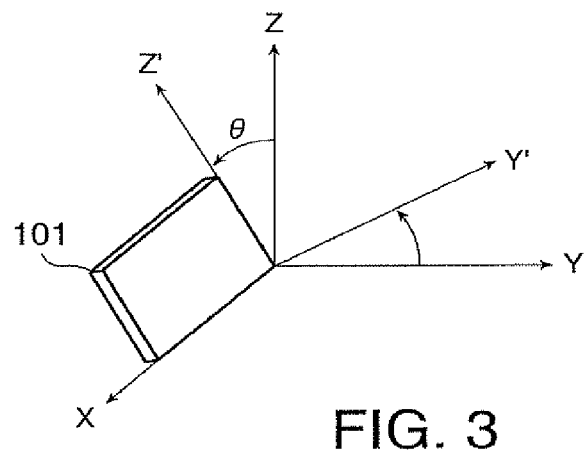
FIG. 3 is a diagram showing the relationship between new orthogonal axes X, Y', Z' acquired by rotating the crystal axes X, Y, Z of a quartz crystal by θ with respect to the X axis and an AT cut quartz crystal substrate.

The piezoelectric material such as a quartz crystal belongs to a trigonal system and, as shown in FIG. 3, has crystal axes X, Y, and Z that are perpendicular to one another. The X axis, the Y axis, and the Z axis are called an electric axis, a mechanical axis, and an optical axis respectively. The AT cut crystal quartz substrate 101 is a planar plate acquired by cutting a crystal quartz raw stone along a plane acquired by rotating the XZ plane with respect to the X axis by an angle θ. In the case of the AT cut crystal quartz substrate 101, the angle θ is approximately 35° 15'. In addition, by rotating the Y axis and the Z axis around the X axis by the angle θ, the Y' axis and the Z' axis are respectively set. Accordingly, the AT cut quartz crystal substrate 101 has the crystal axes X, Y', and Z' that are orthogonal to one another. In the AT cut quartz crystal substrate 101, the thickness direction is the Y' axis, and the XZ' plane (a plane including the X axis and the Z' axis) perpendicular to the Y' axis is the principal face, and a thickness-shear vibration is excited as a main vibration. The piezoelectric substrate 10 can be acquired by processing the AT cut quartz crystal substrate 101.

In other words, as shown in FIG. 3, by using the X axis of the orthogonal coordinate system formed from the X axis (electrical axis), the Y axis (mechanical axis), and the Z axis (optical axis) as the center, and an axis acquired by inclining the Z axis in the −Y direction of the Y axis is set as the Z' axis, an axis acquired by inclining the Y axis in the +Z direction of the Z axis is set as the Y' axis, and the piezoelectric substrate 101 is formed from the AT cut crystal quartz substrate that is configured by a plane parallel to the X axis and the Z' axis and has a thickness in the direction parallel to the Y' axis.

The piezoelectric substrate 10, as shown in FIG. 1A, has a direction (hereinafter, referred to as a "Y' axis direction") parallel to the Y' axis as its thickness direction and has a rectangular shape having its longer side in a direction (hereinafter, referred to as an "X axis direction") parallel to the X axis and its shorter side in a direction (hereinafter, referred to as a "Z' axis direction") parallel to the Z' axis. The piezoelectric substrate 10 includes an excitation portion 14 and a peripheral portion 12 formed along the peripheral edge of the excitation portion 14. Here, the "rectangular shape" includes a literally rectangular shape and an approximately rectangular shape of which corner portions are chamfered.

In at least a part of the peripheral face (side face) of the excitation portion 14, as shown in FIGS. 1A, 1B, and 2, the peripheral portion 12 is formed, and has a thickness (thin walled) smaller than that of the excitation portion 14.

As illustrated in the embodiment shown in FIGS. 1A, 1B, and 2, the excitation portion 14 according to this example has its entire periphery surrounded by the peripheral portion 12 and has a thickness (thin walled) larger than that of the peripheral portion 12 in the Y' axis direction. In other words, the excitation portion 14, as shown in FIGS. 1B and 2, protrudes from the peripheral portion 12 in the Y' axis direction. In the example shown in the figures, the excitation portion 14 protrudes from the peripheral portion 12 on the +Y' axis side and the −Y' axis side. The excitation portion 14, for example, has a point (not shown in the figures) as the center of the symmetry and may have a shape symmetrical with respect to the center point.

The excitation portion 14, as shown in FIG. 1A, has a rectangular shape having its longer side in the X axis direction and its shorter side in the Z' axis direction. In other words, the excitation portion 14 has a side parallel to the X axis as its longer side and a side parallel to the Z' axis as its shorter side. Accordingly, the excitation portion 14 has side faces 14a and 14b extending in the X axis direction and side faces 14c and 14d extending in the Z' axis direction. In other words, the longitudinal direction of the side faces 14a and 14b extending in the X axis direction is the X axis direction, and the longitudinal direction of the side faces 14c and 14d extending in the Z' axis direction is the Z' axis direction. In the example shown in the figures, out of the side faces 14a and 14b, the side face 14a is a side face on the +Z' axis, and the side face 14b is a side face on the −Z' axis. In addition, out of the side faces 14c and 14d, the side face 14c is a side face on the −X axis side, and the side face 14d is a side face on the +X axis.

The side face 14a extending in the X axis direction, for example, as shown in FIG. 1B, is formed so as to protrude from the peripheral portion 12 in the +Y' axis side and the −Y' axis side. This is the same for the side faces 14b, 14c, and 14d. Each of the side faces 14a and 14b extending in the X axis direction, as shown in FIG. 1B, has a shape having no level difference within one plane. In other words, the side face 14a on the +Y' axis side is within one plane, and the side face 14a on the −Y' axis side is within one plane. Similarly, the side face 14b on the +Y' axis side is within one plane, and the side face 14b on the −Y' axis side is within one plane.

In the description here, "within one plane" includes a case where the side face of the excitation portion 14 is a flat face and a case where the side face of the excitation portion 14 has unevenness corresponding to the anisotropy of the quartz crystal. In other words, when an AT cut quartz crystal substrate is processed by using a solution including hydrofluoric acid as an etching solution, as the side face of the excitation portion 14, there are a case where the R plane of the quartz crystal is exposed so as to be parallel to the XY' plane and a case where the m plane of the quartz crystal is exposed so as to have unevenness corresponding to the crystal anisotropy of the quartz crystal. In the description here, the side face having unevenness due to the m plane of the quartz crystal is described to be "within one plane" as well. For convenience of the description, in FIGS. 1A and 1B, the unevenness due to the m plane is not illustrated.

Each of the side faces 14c and 14d extending in the Z' axis direction, as shown in FIG. 2, has a level difference. The excitation portion 14 includes a first portion 15 that is located at the center and has the maximum thickness and a second portion 16 having a thickness smaller than that of the first portion 15, and the level differences of the side faces 14c and 14d are formed in accordance with a difference in the thicknesses of the first portion 15 and the second portion 16. In the example shown in the figures, the side faces 14c and 14d are configured by a face of the first portion 15 that is parallel to the Y'Z' plane, a face of the second portion 16 that is parallel to the XZ' plane, and a face of the second portion 16 that is parallel to the Y'Z' plane.

As above, the excitation portion 14 has two types of portions 15 and 16 having different thicknesses, and the piezoelectric vibration element 100 can be described to have so-called a two-level mesa structure. The piezoelectric vibration element 100 vibrates as a thickness-shear vibration as its main vibration and can have an energy trapping effect due to the two-level mesa structure of the excitation portion 14.

The feature of the piezoelectric vibration element 100 is that, as illustrated in the embodiment of FIGS. 1A, 1B, and 2, the excitation electrode 20 is formed on the front and rear faces of the excitation portion 14, which face each other, having the two-level mesa-type structure and at least a part of the front and rear faces, which face each other, of the peripheral portion 12 that is connected to the side faces of a level difference portions 14a, 14b, 14c, and 14d of the excitation portion 14 and the side faces of the level difference portions 14a to 14d. As above, by broadening the excitation electrode 20 in at least a part of the peripheral portion 12, as will be described later, the electric charge generated at the time of excitation can be more efficiently collected, whereby a piezoelectric vibration element having a higher performance can be formed. In other words, the crystal impedance (CI) of the piezoelectric vibration element 100 can be formed to be small.

Figure 4:
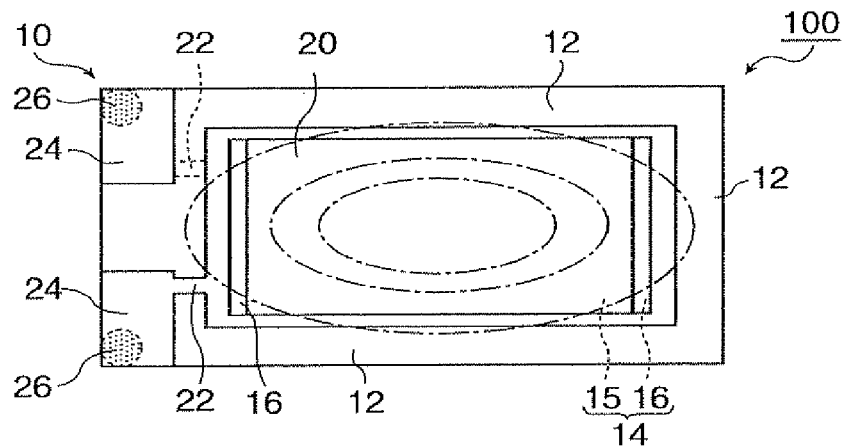
FIG. 4 is a diagram in which equal force lines formed by joining points having the same vibration displacement energy are overwritten on a plane representing the configuration of a piezoelectric vibration element having the mesa structure.

In FIG. 4, the distribution of equal force lines acquired by joining points having the same vibration displacement energy (a product of the square of a vibration displacement and mass at the position) that is generated when the piezoelectric vibration element 100 is excited is denoted by dashed-dotted lines on a plan view of the piezoelectric vibration element 100. The energy level of the equal force line located at the center is the highest, and, as the equal force line is located toward the outer side, the energy level of the equal force line becomes low. In the example of the piezoelectric vibration element 100 shown in FIG. 4, since the excitation portion 14 has a rectangular shape that is long in the X axis direction, the distribution of the equal force lines has an oval shape that has its major axis in the X axis direction and its minor axis in the Z' axis direction. The magnitude of the vibration displacement is the maximum at the center portion of the excitation portion 14, and, as being departed from the center portion, the magnitude of the vibration displacement decreases. In other words, on the excitation electrode 20, the magnitude of the vibration displacement is distributed as an almost cosine in the X axis direction and the Z' axis direction and exponentially attenuates on the piezoelectric substrate on which the excitation electrode 20 is not present. Since the vibration area spreads in an oval shape in the excitation portion 14 and the peripheral portion 12 connected to the excitation portion 14, in an piezoelectric vibration element having a configuration in which the excitation electrode is disposed only on the excitation portion 14, electric charge excited in the piezoelectric substrate 10 cannot be sufficiently collected (cannot be picked up). The piezoelectric vibration element 100 that is configured such that the excitation electrode 20 is arranged at least in apart of the peripheral portion 12 connected to the excitation portion 14 so as to collect electric charge excited in the piezoelectric substrate 10 has excellent performance as a piezoelectric vibration element.

Generally, the performance of a piezoelectric vibrator is evaluated as an electromechanical coupling coefficient $k^2$. In other words, as the electromechanical coupling coefficient $k^2$ is higher, the electro-to-mechanical conversion efficiency is higher. Since the capacitance ratio γ is inversely proportional to the electromechanical coupling coefficient $k^2$, the higher performance is, the lower the capacitance ratio γ is. Here, the capacitance ratio γ is represented as a ratio C0/C1 of the electrostatic capacitance C0 to the serial resonance capacitance C1. In addition, as a performance evaluation index of a piezoelectric vibrator, Q/γ is also used.

Meanwhile generated electric charge is proportional to distortion St. The distortion St is acquired by differentiating the vibration displacement at the coordinate position. In other words, the generated electric charge changes in accordance with the vibration displacement of the piezoelectric substrate 10. The vibration displacement of the excitation electrode 20 has a cosine shape having the vertex at the center of the excitation electrode 20. In other words, the vibration displacement at the end portion of the excitation electrode 20 is smaller than that at the center portion. Even when the excitation electrode 20 is formed to be large more than is necessary, electric charge cannot be efficiently collected.

Figure 5:
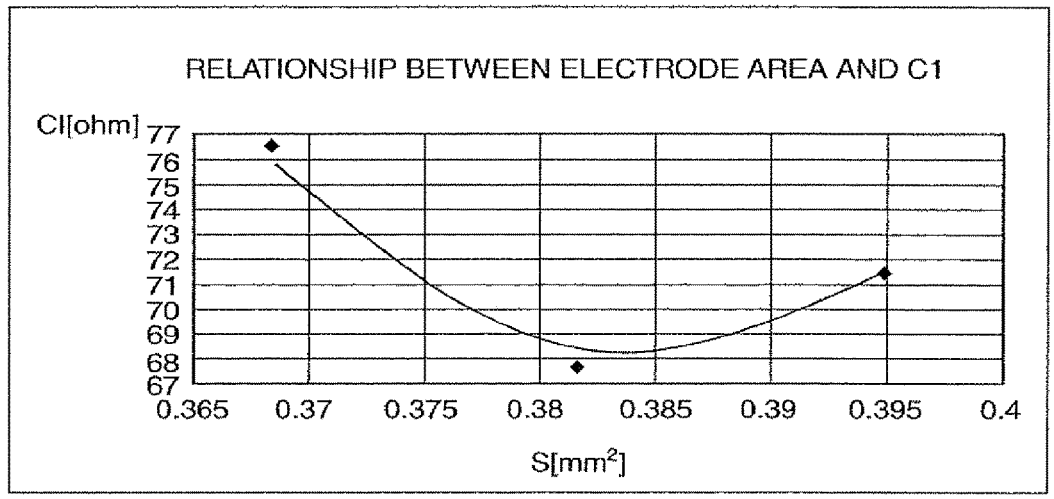
FIG. 5 is a diagram illustrating the relationship between an electrode area and the crystal impedance of a piezoelectric vibration element having the mesa structure.

FIG. 5 is a diagram illustrating the result of measuring the CI when the area S of the excitation electrode is changed by using an AT cut quartz crystal substrate having the mesa structure of which the dimension X in the X axis direction is 1100 μm and the thickness t is 65 μm as the piezoelectric substrate housed in a 1612-size (1.6 mm×1.2 mm) package. According to this experiment, it has found that the CI of the quartz crystal vibrator is high when the area S is small, and the CI decreases as the area S increases, and the CI increases as the area S is increased further. In other words, it has been found through an experiment that there is the electrode area S for which the CI is minimal when the dimension of the quartz crystal substrate is determined.

Figure 6:
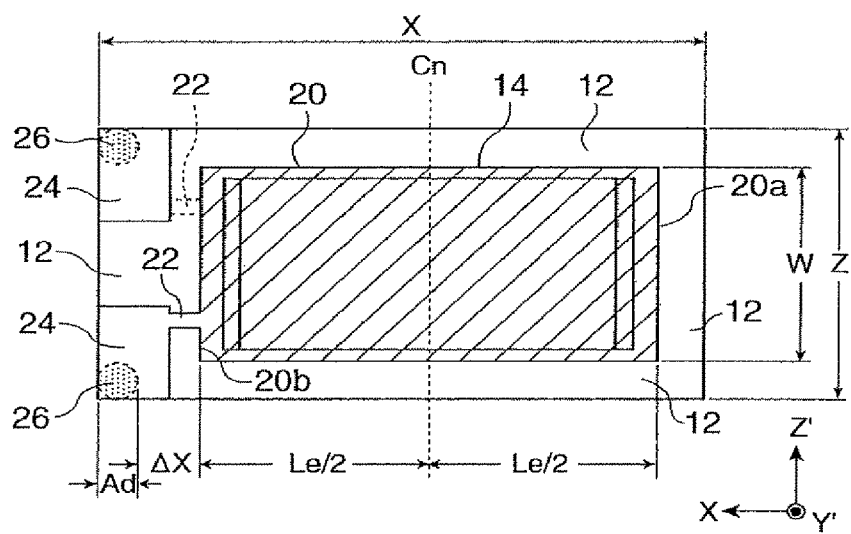
FIG. 6 is a diagram acquired by writing the dimension of an excitation electrode, the dimension between a support area and the excitation electrode, and the like on a plan view of a piezoelectric vibration element having the mesa structure.

Furthermore, in order to check the relationship between the dimension of the quartz crystal substrate 10 in the X axis direction and the dimension of the excitation electrode 20, experiments were repeated. In FIG. 6, the dimension of each portion is written on the plan view of the piezoelectric vibration element 100 shown in FIG. 1A, and the excitation electrode 20 is denoted by a diagonal line. In other words, the excitation electrode 20 is arranged over the excitation portion 14 and a part of the peripheral portion 12 connected to the excitation portion 20. It is assumed that the dimension of the quartz crystal substrate 10 in the X axis direction is X, and the dimension of the excitation electrode 20 in the X axis direction is Le. In the example shown in FIG. 6, the excitation electrode 20 extends over the entire area of the excitation portion 14 and a part of the peripheral portion 12. It is assumed that the dimension of a support area 26 (an area that is used for fixing the quartz crystal substrate 10 to the support member using a conductive adhesive or the like) disposed inside each pad 24 of the quartz crystal substrate 10 is Ad, and a distance between an end portion of the quartz crystal substrate 10 of the support area 26 that is located near the center and the end portion 20b of the excitation electrode 20 that faces the support area 26 is ΔX.

Figure 7:
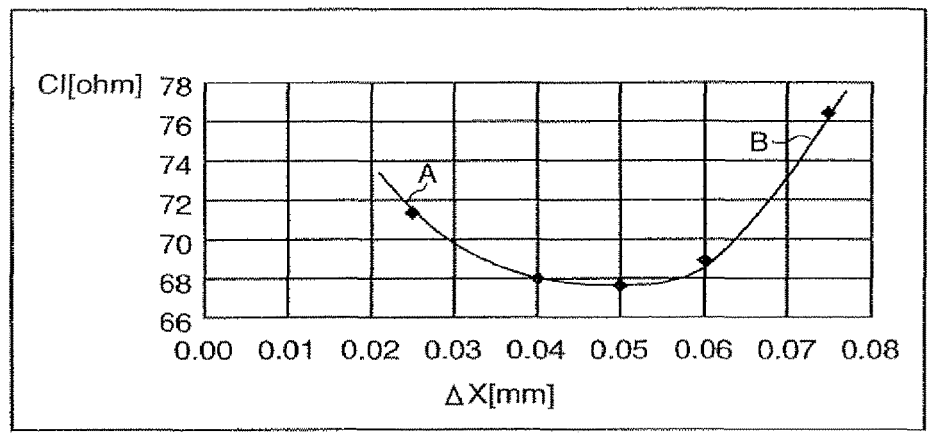
FIG. 7 is a diagram illustrating the relationship between the dimension between the support area and the excitation electrode and the crystal impedance of a piezoelectric vibration element having the mesa structure.

FIG. 7 is a diagram illustrating the relationship between the distance ΔX and the CI of the quartz crystal vibrator having the mesa structure. When the distance ΔX is short, the CI is large, the CI decreases as the distance ΔX increases, and when the distance ΔX is increased further, the CI increases.

FIG. 7 shows a ΔX-CI curve that represents the relationship between the distance ΔX and the CI of the piezoelectric vibration element 100. The ΔX-CI curve was estimated to be configured by curves representing two mechanisms having different characteristics, that is, a curve A that monotonously decreases and a curve B that monotonously increases. The CI represented by the curve A decreases in accordance with an increase in the distance ΔX. This mechanism is understood as follows. The vibration displacement distribution on the excitation electrode 20 has an almost cosine shape, and the vibration displacement of the peripheral portion 12 in which the excitation electrode 20 is not present exponentially decreases with the distance of the excitation electrode 20 from the end portion 20b used as a variable. The support area 26 is an area that is coated with a conductive adhesive or the like and is used for fixing the quartz crystal substrate 10 to a support member such as a package. The vibration displacement energy that abruptly decreases from the end portion 20b of the excitation electrode 20 arrives at the support area 26 and dissipates as it is absorbed by the adhesive with which the support area 26 is coated and leaks. In other words, as the distance ΔX increases, the vibration energy arriving at the end portion (end portion located on the right side in the figure) of the support area 26 decreases, and the leaking energy decrease. As a result, the Q value of the quartz crystal vibrator increases, and the CI decreases.

In contrast to this, when the distance ΔX decreases, the vibration energy arriving at the end portion (end portion located on the right side in the figure) of the support area 26 increases, and the leaking energy increases, whereby the Q value decreases. Accordingly, the CI increases. The CI is represented as a curve A that monotonously decreases in accordance with an increase in the distance ΔX.

On the other hand, the curve B is understood as follows. It is widely known that the Q value of the quartz crystal vibrator that is determined only by an internal loss decreases in inversely proportional to the frequency f. In a case where the range of the frequency is not that high, in the quartz crystal substrate 10 having a dimension in the X axis direction being about 1.1 mm, when the shape and the dimension are determined, the Q value is understood as an almost constant value unless the dimension of the excitation electrode is changed to a large extent. In addition, it is known that the equivalent serial inductance (motional inductance) L1 of the quartz crystal vibrator is in proportion to the cube of the thickness t of the quartz crystal substrate and is in inverse proportion to the electrode area.

The excitation electrode 10 is assumed to be arranged to be symmetrical with respect to the center line Cn, as shown in FIG. 6. Here, a case will be described in which the quartz crystal substrate 10 is ideally supported and fixed such that the effect of the adhesive used for fixing the quartz crystal substrate 10 can be ignored. As the distance ΔX decreases, in other words, as the dimension Le of the excitation electrode 20 increases, the electric charge excited in the quartz crystal substrate 10 is collected. Since the vibration displacement is distributed as a cosine shape having the vertex at the center of the excitation portion 14, the efficiency of collection of the electric charge in the end portion of the excitation electrode 20 is low. Accordingly, it is not true that the excitation electrode 20 having a larger size is preferable.

There is a dimension of the excitation electrode 20 that is optimal to the capacitance ratio γ that is the ratio C0/C1 of the electrostatic capacitance C0 that is determined in proportion to the dimension of the excitation electrode 20 to the equivalent serial capacitance C1 determined by the dimension of the excitation electrode 20. Since the equivalent serial inductance L1 and the equivalent serial capacitance C1 have the relationship of $\omega_0^2=1/(L1 \cdot C1)$, as the dimension Le of the excitation electrode 20 increases, the serial inductance L1 decreases. When the Q value is set to be almost constant, the CI of the quartz crystal vibrator decreases. In other words, as the excitation electrode 20 increases (the dimension Le is increased), in other words, as the distance ΔX is decreased, the CI decreases.

However, since the vibration displacement decreases on the peripheral edge of the peripheral portion 12, the electric charge excited at that portion is small, and it is not efficient to dispose an electrode at the portion. In addition, it is necessary to consider the leakage from the support and fixing portion. As the distance ΔX is increased, although the dimension Le of the excitation electrode 20 decreases, there is the dimension Le of the excitation electrode 20 for which the electric charge excited in the quartz crystal substrate 10 can be collected the most efficiently. In other words, there is the dimension Le for which the capacitance ratio γ is the minimum. Furthermore, as the distance ΔX is increased further, the dimension Le decreases, and the serial inductance L1 increases. When the Q value is assumed to be almost constant, this corresponds to an increase in the CI. Accordingly, as represented by the monotonously increasing curve of the curve B shown in FIG. 7, it can be understood that the CI increases in accordance with an increases in the distance ΔX.

In other words, in a case where the dimension of the quartz crystal substrate 10 is determined, when focusing on the CI of the quartz crystal vibrator, there is a range of the distance ΔX from the support area 26 for which the CI decreases. In FIG. 7, when the CI is assumed to be 68Ω, the range of the distance ΔX is 0.04 mm≤ΔX≤0.06 mm. The range of ΔX was experimented as the X side ratio X/t in the range of 14≤X/t≤18, and the same result was acquired.

In addition, as the piezoelectric vibration element 100 having the mesa structure, when the dimension (the dimension of a shorter side) of the piezoelectric substrate 10 in the Z' axis direction is Z, the dimension of the shorter side of the excitation portion 14 is Mz, and the thickness (the thickness of a first portion 15 of the excitation portion 14) of the excitation portion 14 is t, it is preferable to satisfy the relationship of the following Equation (1).

$$8 \leq Z/t \leq 11 \text{ and } 0.6 \leq Mz/Z \leq 0.8 \quad (1)$$

Accordingly, a combination of the thickness-shear vibration and an unnecessary mode such as a contour vibration can be suppressed, and therefore, a decrease in the CI and the enhancement of the frequency-temperature characteristic can be achieved (which will be described later in detail). Generally, the combination of the thickness-shear vibration and the contour vibration is more difficult to suppress, as the area of the piezoelectric substrate is smaller. Accordingly, for example, in a case where the dimension (the dimension of the longer side) of the piezoelectric substrate in the X axis direction is X, when the small-size piezoelectric vibration element 100 satisfying the relationship of the following Equation (2) is designed so as to satisfy the relationship of Equation (1) described above together, the combination of the thickness-shear vibration and the contour vibration can be suppressed further.

$$X/t \leq 18 \quad (2)$$

The excitation electrode 20 is formed in the excitation portion 14 and at least a part of the peripheral portion 12 connected to the excitation portion 14. In the example shown in FIGS. 1B and 2, the excitation electrode 20 is formed so as to be interposed between the front and rear face of the excitation portion 14 and a part of the front and rear faces of the peripheral portion 12 connected to the excitation portion 14. The excitation electrode 20 acts so as to excite the vibration area of the piezoelectric substrate 10.

The piezoelectric vibration element 100 according to this embodiment, for example, has the following featured advantages.

As shown in the example shown in FIGS. 1A, 1B, and 2, the piezoelectric vibration element 100 is configured in which the excitation electrode 20 is disposed in the excitation portion 14, which has a level difference portion in the thickness direction along one direction (the Z' axis direction), having the mesa structure and at least apart of the peripheral portion 12 connected to the peripheral edge of the excitation portion 14. Although the vibration energy is mainly trapped in the excitation portion 14, the electric charge generated when the piezoelectric vibration element is excited is efficiently collected by the excitation electrode 20 that is disposed in a part of the peripheral portion 12. As a result, there is an advantage that the piezoelectric vibration element having low CI can be acquired, and the piezoelectric vibration element 100 can be acquired in which the frequency-temperature characteristics are superior, and the combination of the thickness-shear vibration and the contour vibration in the Z' axis direction is suppressed.

In addition, as shown in FIGS. 6 and 7, for the piezoelectric vibrator 100 having the range of the X side ratio X/t of "14≤X/t≤18", by configuring the piezoelectric vibration element 100 so as to satisfy the relationship of "0.04 mm≤ΔX≤0.06 mm" when the distance between the end portion of the support area 26 and the end portion 20b of the excitation electrode 20 that face each other is ΔX, there is an advantage that the CI of the piezoelectric vibration element 100 can be configured to be low.

In addition, according to the piezoelectric vibration element 100, as described above, by setting the dimension Z of the shorter side of the piezoelectric substrate 10, the dimension Mz of the shorter side of the excitation portion 14, and the thickness t of the first portion 15 of the excitation portion 14 so as to satisfy the relationship of Equation (1), the combination of the thickness-shear vibration and the contour vibration in the Z' axis direction is suppressed, and there is an advantage that the piezoelectric vibration element 100 having low CI can be acquired.

2. Method of Manufacturing Piezoelectric Vibration Element

Next, a method of manufacturing the piezoelectric vibration element according to this embodiment will be described with reference to the drawings. FIGS. 7 to 9C are diagrams schematically illustrating the manufacturing process of the piezoelectric vibration element 100 according to this embodiment. In addition, FIGS. 5 to 9C correspond to FIG. 2. In other words, cross-sectional views viewed from the Z' axis direction are illustrated.

Figure 8:
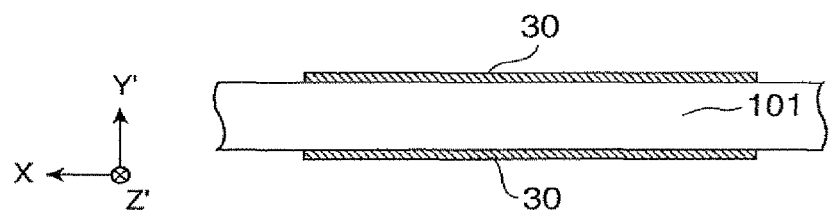
FIG. 8 is a cross-sectional view showing an AT cut quartz crystal substrate in which corrosion-resistant films are formed on the front and rear faces thereof.

As shown in FIG. 8, a corrosion-resistant film 30 is formed on the front and rear principal faces (faces parallel to the XZ' plane) of the AT cut quartz crystal substrate 101. The corrosion-resistant film 30 is formed by stacking chromium and gold in the mentioned order, for example, by using a sputtering method, a vacuum deposition method, or the like and then patterning the chromium and gold. The patterning is performed, for example, by using the photolithographic technique and the etching technique. The corrosion-resistant film 30 has corrosion resistivity against a solution containing hydrofluoric acid that is used as an etching solution when the AT cut quartz crystal substrate 101 is processed.

Figure 9A:
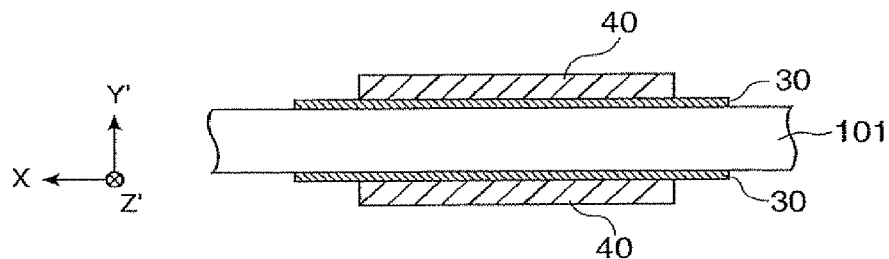
FIGS. 9A to 9C are cross-sectional views schematically illustrating a method of manufacturing a piezoelectric vibration element of this embodiment.

As shown in FIG. 9A, after the corrosion-resistant film 30 is coated with a photoresist film of the positive type, the photoresist film is exposed and developed, whereby a resist film 40 having a predetermined shape is formed. The resist film 40 is formed so as to cover a part of the corrosion-resistant film 30.

Figure 9B:
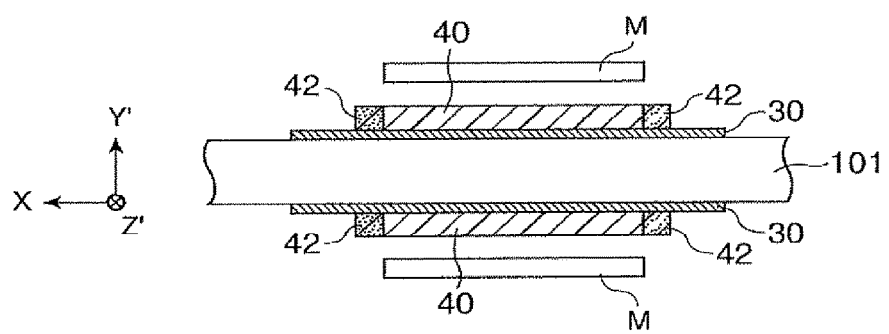

Next, as shown in FIG. 9B, a part of the resist film 40 is exposed again by using a mask M, thereby forming a photosensitive portion 42. In other words, exposure is performed while the mask M is arranged on the inner side of the outer edge of the resist film 40 when viewed from the Y' axis direction.

Figure 9C:
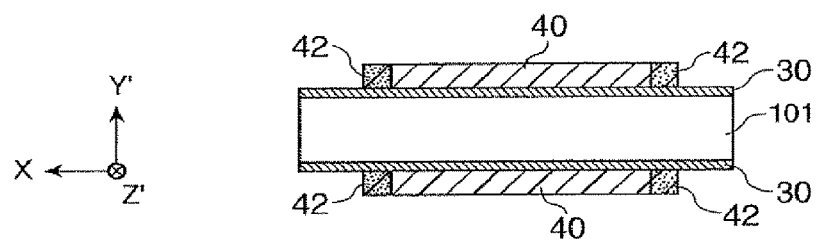

Next, as shown in FIG. 9C, the AT cut quartz crystal substrate 101 is etched by using the corrosion-resistant film 30 as a mask. The etching is performed, for example, by using a mixed solution of hydrofluoric acid and ammonium fluoride as an etching solution. Accordingly, the outer shape (the shape viewed from the Y' axis direction) of the piezoelectric substrate 10 is formed.

Figure 10A:
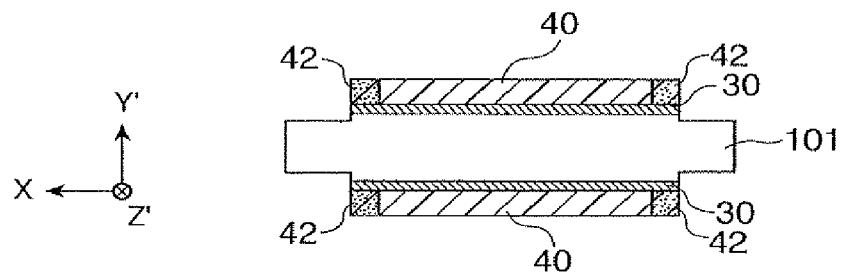
FIGS. 10A to 10C are cross-sectional views schematically illustrating a method of manufacturing a piezoelectric vibration element of this embodiment.

Next, as shown in FIG. 10A, after the corrosion-resistant film. 30 is etched by using the resist film 40 as a mask and a predetermined etching solution, the AT cut quartz crystal substrate 101 is half-etched up to a predetermined depth by using the above-descried mixed solution as an etching solution, whereby the outer shape of the excitation portion 14 is formed.

Figure 10B:
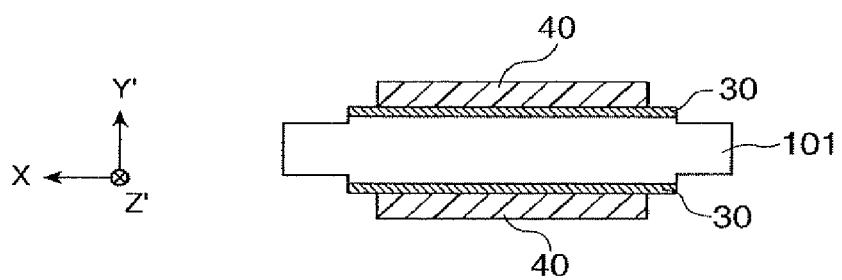

Next, as shown in FIG. 10B, the photosensitive portion 42 of the resist film 40 is developed so as to be removed. Accordingly, a part of the corrosion-resistant film 30 is exposed. In addition, before the photosensitive portion 42 is developed, asking is performed for an altered layer (not shown) formed on the surface of the resist film 40, for example, by using oxygen plasma formed by electric discharge under a vacuum or decompressed atmosphere. Accordingly, the photosensitive portion 42 can be reliably developed so as to be removed.

Figure 10C:
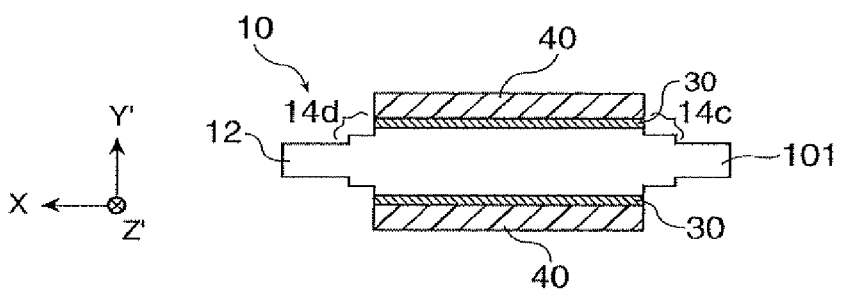

Next, as shown in FIG. 10C, after the exposed portion of the corrosion-resistance film 30 is etched so as to be removed by using the resist film 40 as a mask and a predetermined etching solution, the AT cut quartz crystal substrate 101 is half-etched up to a predetermined depth by using the above-described mixed solution as an etching solution. Accordingly, a level difference can be formed in each of the side faces 14c and 14d that extend in the Z' axis direction. In addition, although not shown in the figure, a level difference can be formed in each of the side faces 14a and 14b that extend in the X axis direction.

Through the above-described process, the piezoelectric substrate 10 having the peripheral portion 12 and the excitation portion 14 can be formed.

After the resist film 40 and the corrosion-resistant film 30 are removed, by stacking chromium and gold in the mentioned order, for example, by using a sputtering method, a vacuum deposition method, or the like and then patterning the chromium and gold, an excitation electrode 20, a drawn-out electrode 22, and a pad 24 are formed in the piezoelectric substrate 10. In other words, as illustrated in the example of FIGS. 1A, 1B, and 2, the piezoelectric vibration element in which the excitation electrode 20 is disposed in the entire area of the excitation portion 14 and a partial area of the peripheral portion 12 connected to the excitation portion 14 is formed.

Through the above-described process, the piezoelectric vibration element 100 according to this embodiment can be manufactured.

According to the method of manufacturing the piezoelectric vibration element 100, after the resist film 40 is developed so as to remove the photosensitive portion that is used for forming the outer shape of the excitation portion 14, the AT cut quartz crystal substrate 101 is etched again by using the resist film 40, whereby the excitation portion 14 can be formed. Accordingly, the excitation portion 14 having a two-level mesa structure can be formed with high precision.

For example, in a case where the resist film coating is performed twice so as to form the excitation portion 14 (for example, in a case where, after the outer shape of the excitation portion is formed by using a first resist film, the first resist film is peeled off, and coating using a second resist film is newly performed so as to expose the side face of the excitation portion), the excitation portion 14 may not be formed with high precision due to the occurrence of misalignment in the combination of the first resist film and the second resist film. According to the method of manufacturing the piezoelectric vibration element 100, such a problem can be solved.

3. Modified Example of Piezoelectric Vibration Element

Figure 11A:
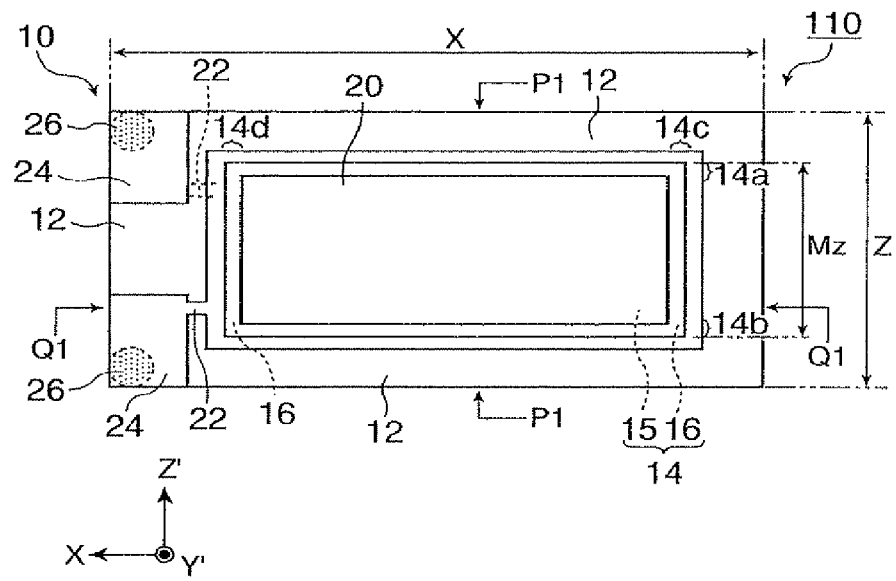
FIGS. 11A and 11B are schematic diagrams of a piezoelectric vibration element having the mesa structure according to another embodiment.
Figure 11B:
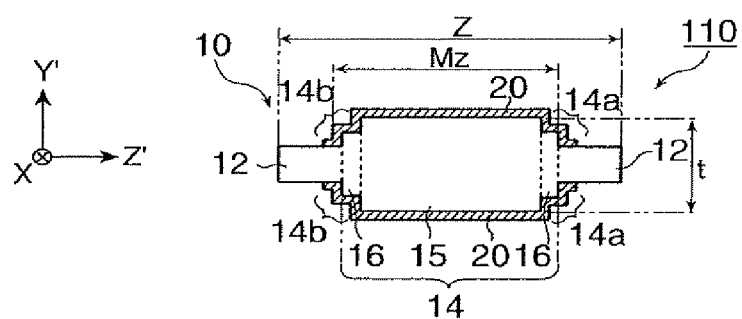
Figure 12:
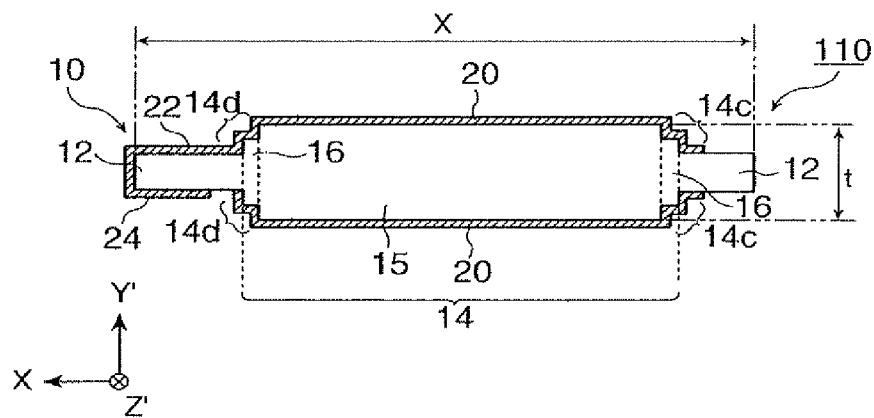
FIG. 12 is a cross-sectional view taken along line Q1-Q1 shown in FIG. 11A.

Next, the piezoelectric vibration element according to a modified example of this embodiment will be described with reference to the drawings. FIG. 11A is a plan view schematically showing a piezoelectric vibration element 110 according to a modified example of this embodiment, and FIG. 11B is a cross-sectional view taken along line P1-P1 shown in FIG. 11A. FIG. 12 is a cross-sectional view taken along line Q1-Q1 shown in FIG. 11A. Hereinafter, in the piezoelectric vibration element 110 according to the modified example of this embodiment, the same reference numeral is assigned to a member having the same structure and the same function as those of the piezoelectric vibration element 100 according to this embodiment, and detailed description thereof will not be presented.

The piezoelectric vibration element 110 according to this modified example of the invention mainly includes: a piezoelectric substrate 10 that includes an excitation portion 14 that is located at the center and has a multi-level mesa structure; and a thin-walled peripheral portion 12 that is continuously formed on the peripheral edge of the excitation portion 14; excitation electrodes 20 that are arranged on both principle faces of the excitation portion 14 so as to face each other; drawn-out electrodes 22 that extend from the excitation electrodes 20 toward end portion of the piezoelectric substrate 10; and pads 24 that are formed in the end portions of the drawn-out electrodes 22 and in two corner portions of the piezoelectric substrate 10.

The excitation portion 14 is a thick portion that is formed by protruding an approximately center portion of the piezoelectric substrate in both the principal face directions, and the peripheral portion 12 is formed so as to longitudinally protrude from a center portion of at least a part of the outer peripheral side face of the excitation portion 14 in the thickness direction toward the outer diameter direction. The peripheral portion 12 according to this example is longitudinally formed in a flange shape from the entire outer peripheral side face of the excitation portion 14.

The piezoelectric substrate 10 includes: an excitation portion 14 that is located at the center and is a main vibration area and a peripheral portion 12 that is thin-walled thinner than the excitation portion 14, and is formed along the entire peripheral edge of the excitation portion 14 in a flange shape. All the side faces of the excitation portion 14 having a planar shape of an almost rectangle have a structure having a level difference portion in the thickness direction. In other words, as shown in FIGS. 11B and 12, the piezoelectric substrate 10 is a piezoelectric substrate that includes the excitation portion 14 of which all the side faces have a stair shape viewed from each side face and the peripheral portion 12 that is connected to the periphery of the center portion of the excitation portion 14 in the thickness direction.

As illustrated in FIGS. 11A, 11B, and 12, the excitation portion 14 according to this example has side faces each having a level difference shape, and its entire periphery surrounded by the peripheral portion 12, and has a thickness (thick walled) larger than that of the peripheral portion 12 in the Y' axis direction. In other words, the excitation portion 14, as shown in FIGS. 11B and 12, protrudes from the peripheral portion 12 in both directions of the Y' axis directions. In the example shown in the figures, the excitation portion 14 protrudes from the peripheral portion 12 on the +Y' axis side and the −Y axis side. The excitation portion 14, for example, has a point (not shown in the figures) as the center of the symmetry and may have a point-symmetry shape (in 2D, and point symmetry in 3D) that is symmetrical with respect to the center point.

The excitation portion 14, as shown in FIG. 11A, has a rectangular shape having its longer side in the X axis direction and its shorter side in the Z' axis direction. In other words, the excitation portion 14 has a side parallel to the X axis as its longer side and a side parallel to the Z' axis as its shorter side. Accordingly, the excitation portion 14 has side faces 14a and 14b extending in the X axis direction and side faces 14c and 14d extending in the Z' axis direction. In other words, the longitudinal direction of the side faces 14a and 14b extending in the X axis direction is the X axis direction, and the longitudinal direction of the side faces 14c and 14d extending in the Z' axis direction is the Z' axis direction. In the example shown in the figures, out of the side faces 14a and 14b, the side face 14a is a side face on the +Z' axis, and the side face 14b is a side face on the −Z' axis. In addition, out of the side faces 14c and 14d, the side face 14c is a side face on the −X axis side, and the side face 14d is a side face on the +X axis.

As shown in FIGS. 11A, 11B, and 12, the excitation portion 14 has a first portion 15 that is the thickest and a second portion 16 having a thickness smaller than the first portion 15. The first portion 15, as shown in FIGS. 11A and 11B, has a rectangular shape having a longer side in a direction parallel to the X axis and a shorter side in a direction parallel to the Z' axis. The second portion 16 is formed on the periphery of the first portion 15.

Each of the level difference of the side faces 14a and 14b of the excitation portion 14 is formed in accordance with a difference in the thicknesses of the first portion 15 and the second portion 16. In the example shown in the figures, the side faces 14a and 14b are configured by a face of the first portion 15 that is parallel to the XY' plane, a face of the second portion 16 that is parallel to the XZ' plane, and a face of the second portion 16 that is parallel to the XY' plane. Similarly, each of the level difference of the side faces 14c and 14d of the excitation portion 14 is formed in accordance with a difference in the thicknesses of the first portion 15 and the second portion 16 and the side faces 14c and 14d are configured by a face of the first portion 15 that is parallel to the Y'Z' plane, a face of the second portion 16 that is parallel to the XZ' plane, and a face of the second portion 16 that is parallel to the Y'Z' plane.

As above, the excitation portion 14 has two types of portions 15 and 16 having different thicknesses, and the piezoelectric vibration element 100 can be described to have a two-level mesa structure. The excitation portion 14 can vibrate using the thickness-shear vibration as its main vibration.

As in the example of FIGS. 11A, 11B, and 12, the piezoelectric vibration element 110 is configured in which the excitation electrode 20 is disposed in the excitation portion 14 having level difference portions in two side faces parallel to the X axis and two side faces parallel to the Z' axis in the thickness direction and at least a part of the peripheral portion 12 connected to the peripheral edge of the excitation portion 14. Although the vibration energy is mainly trapped in the excitation portion 14, the electric charge generated when the piezoelectric vibration element 110 is excited is efficiently collected by the excitation electrode 20 that is disposed in a part of the peripheral portion 12. As a result, there is an advantage that the piezoelectric vibration element having low CI can be acquired, and the piezoelectric vibration element in which an unnecessary mode such as bending is decreased can be acquired.

Figure 13:
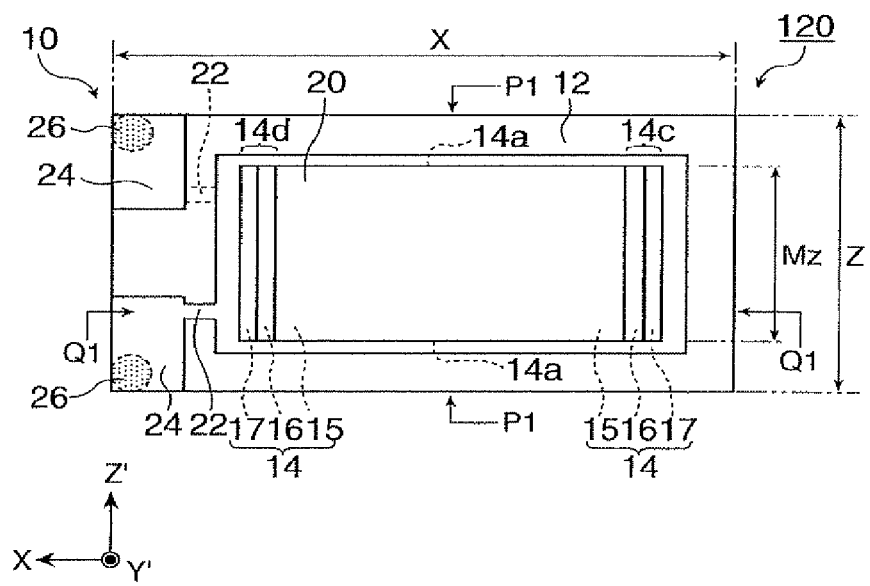
FIG. 13 is a schematic plan view of a piezoelectric vibration element having the mesa structure according to another embodiment.
Figure 14A:
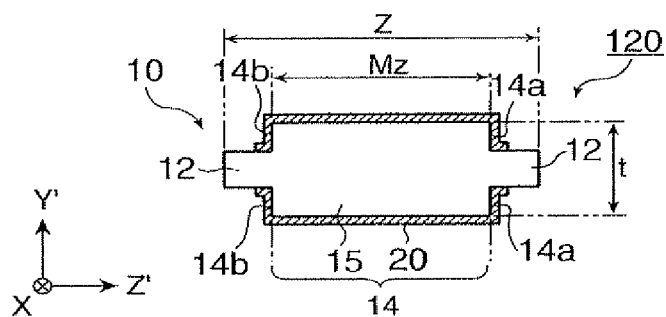
FIG. 14A is a cross-sectional view taken along line P1-P1 shown in FIG. 13.

FIG. 13 is a schematic plan view of a piezoelectric vibration element 120 according to another modified example of this embodiment. FIG. 14A is a cross-sectional view taken along line P1-P1 shown in FIG. 13, and FIG. 14B is a cross-sectional view taken along line Q1-Q1 shown in FIG. 13.

The piezoelectric vibration element 120 has a three-level mesa structure. In other words, in addition to the first portion 15 and the second portion 16, the excitation portion 14 of the piezoelectric vibration element 120 includes a third portion 17 having a thickness smaller than the second portion 16. The third portions 17 are formed so as to have the first portion 15 and the second portion 16 interposed therebetween in the X axis direction.

Figure 14B:
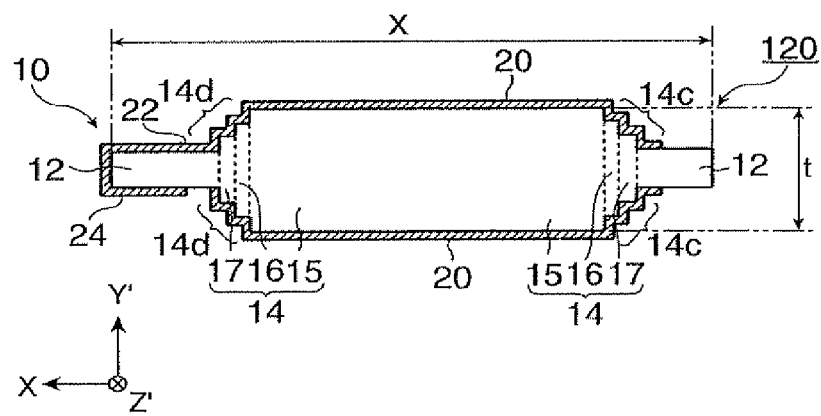
FIG. 14B is a cross-sectional view taken along line Q1-Q1 shown in FIG. 13.

The level differences of the side faces 14c and 14d extending in the Z' axis direction, as shown in FIG. 14B, are formed in accordance with differences in the thicknesses of the first portion 15, the second portion 16, and the third portion 17. In the example shown in the figure, the side faces 14c and 14d are configured by a face of the first portion 15 that is parallel to the Y'Z' plane, a face of the second portion 16 that is parallel to the XZ' plane, a face of the second portion 16 that is parallel to the Y'Z' plane, a face of the third portion 17 that is parallel to the XZ' plane, and a face of the third portion 17 that is parallel to the Y'Z' plane.

In addition, in the excitation portion 14 that is formed from the first portion 15, the second portion 16, and the third portion 17, the peripheral portion 12 having a thickness smaller than the third portion 17 is formed along the peripheral edge of the third portion 17. The excitation electrodes 20 that are formed in the excitation portion 14 and a part of the peripheral portion 12 so as to have the front and rear faces facing each other, the drawn-out electrodes 22 extending from each excitation electrode 20, and two pads 24 that are tip ends of the drawn-out electrodes 22 are formed similarly to the piezoelectric vibration element 100. The piezoelectric vibration element 200 can be manufactured by applying the method of manufacturing the piezoelectric vibration element 100. According to the piezoelectric vibration element 120, the energy trapping effect can be improved, compared to that of the piezoelectric vibration element 100 having two-level mesa structure. Furthermore, the vibration energy mainly is trapped in the excitation portion 14, and according to the excitation electrode 20 of this example of the invention, the electric charge generated when the piezoelectric vibration element 120 is excited is efficiently collected by the excitation electrode 20. As a result, there is an advantage that the piezoelectric vibration element having low CI can be acquired, and the piezoelectric vibration element 120 in which a combination with an unnecessary mode such as bending vibration is decreased can be acquired.

Figure 15A:
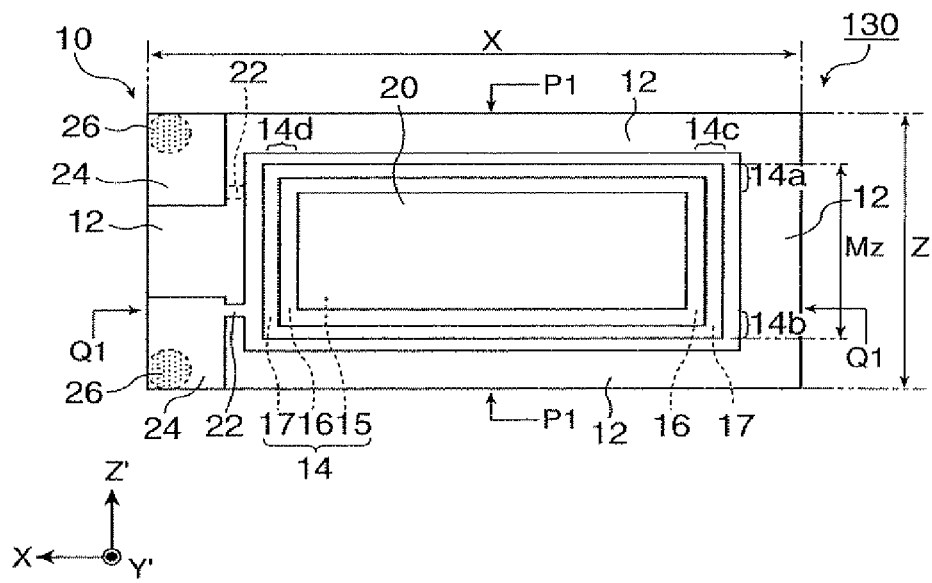
FIGS. 15A and 15B are schematic diagrams of a piezoelectric vibration element having the mesa structure according to another embodiment.
Figure 15B:
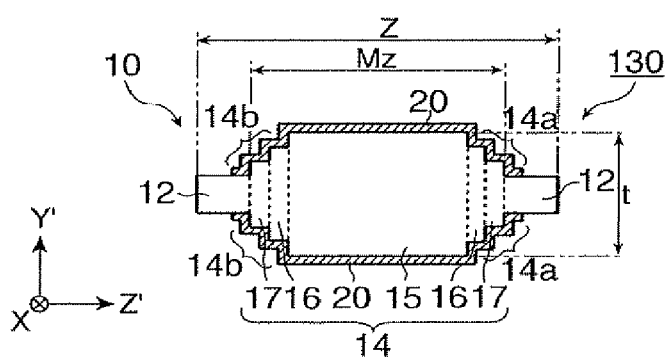
Figure 16:
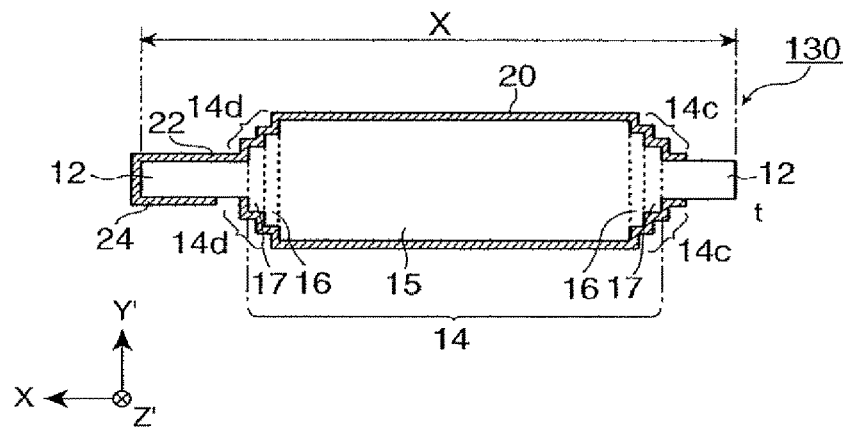
FIG. 16 is a cross-sectional view taken along line Q1-Q1 shown in FIG. 15A.

FIG. 15A is a schematic plan view of a piezoelectric vibration element 130 according to another modified example of this embodiment, and FIG. 15B is a cross-sectional view taken along line P1-P1 shown in FIG. 15A. FIG. 16 is a cross-sectional view taken along line Q1-Q1 shown in FIG. 15A.

The piezoelectric vibration element 130 is a piezoelectric vibration element having a three-level mesa structure. In other words, in addition to the first portion 15 and the second portion 16, the excitation portion 14 of the piezoelectric vibration element 130 includes the third portion 17 having a thickness smaller than the second portion 16. The third portion 17 is formed so as to surround the peripheral edge of the second portion 16. To the peripheral edge of the excitation portion 14, that is, the peripheral edge at the center portion of the side face of the third portion 17 in the thickness direction, the peripheral portion 12 is integrally connected. The excitation electrodes 20 that are formed on both principal faces of the excitation portion 14 and a part of the peripheral portion 12 so as to have the front and rear faces facing each other, the drawn-out electrodes 22 extending from each excitation electrode 20, and two pads 24 that are tip ends of the drawn-out electrodes 22 are formed similarly to the piezoelectric vibration element 100.

The piezoelectric vibration element 130 can be manufactured by applying the method of manufacturing the piezoelectric vibration element 100. According to the piezoelectric vibration element 130, the energy trapping effect can be improved, compared to that of the piezoelectric vibration element 110 having two-level mesa structure. Furthermore, the vibration energy mainly is trapped in the excitation portion 14, and according to the excitation electrode 20 of this example of the invention, the electric charge generated when the piezoelectric vibration element 120 is excited is efficiently collected by the excitation electrode. As a result, there is an advantage that the piezoelectric vibration element having low CI can be acquired, and the piezoelectric vibration element 120 in which a combination with an unnecessary mode such as bending vibration is decreased can be acquired.

In addition, in the above-described example, although the piezoelectric vibration elements 120 and 130 having the three-level mesa structure have been described, the number of levels (the number of level differences) of the mesa structure is not particularly limited in the multi-level mesa structure according to the embodiment of the invention.

4. Piezoelectric Vibrator

Figure 17:
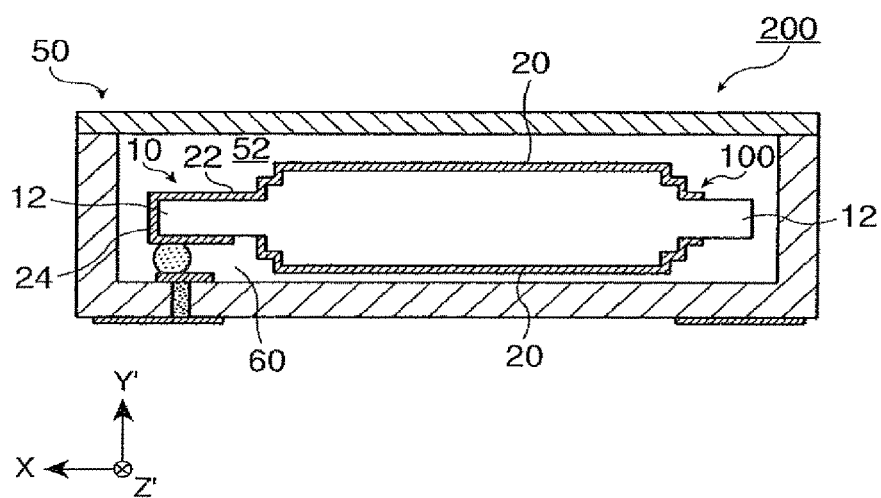
FIG. 17 is a cross-sectional view schematically showing a piezoelectric vibrator according to this embodiment.

Next, a piezoelectric vibrator according to this embodiment will be described with reference to the drawings. FIG. 17 is a cross-sectional view schematically showing a piezoelectric vibrator 200 according to this embodiment.

FIG. 17 is a longitudinal (the X axis direction) cross-sectional view showing the configuration of the piezoelectric vibrator 200 and is a cross-sectional view taken at the same position as that of the cross-sectional view of the piezoelectric vibration element 100 shown in FIG. 2. The piezoelectric vibrator 200, as shown in FIG. 17, includes a piezoelectric vibration element (although this is the piezoelectric vibration element 100 in the example shown in the figure, any of the piezoelectric vibration elements 110, 120, and 130 may be similarly applied) and a package 50.

The package 50 can house the piezoelectric vibration element 100 inside a cavity 52. As examples of the material of the package 50, there are ceramics, glass, and the like. The cavity 52 is formed as a space for the operation of the piezoelectric vibration element 100. The cavity 52 is sealed and forms a decompressed space or the atmosphere of inert gas.

The piezoelectric vibration element 100 is housed inside the cavity 52 of the package 50. In the example shown in the figure, the inside of the support area 26 is precisely coated with a conductive adhesive 60, and the piezoelectric vibration element 100 is fixed in a cantilevered shape inside the cavity 52. As the conductive adhesive 60, for example, solder, a silver paste, or the like can be used.

As illustrated in the embodiment shown in FIG. 17, according to the piezoelectric vibrator 200, the piezoelectric vibration element 100 according to the embodiment of the invention is included. Accordingly, there is an advantage that the piezoelectric vibrator 200 having low CI can be acquired in which there is no combination with an unnecessary vibration such as a bending vibration.

5. Electronic Device and Piezoelectric Oscillator

Next, an electronic device and a piezoelectric oscillator according to embodiments will be described with reference to the drawings.

Figure 18A:
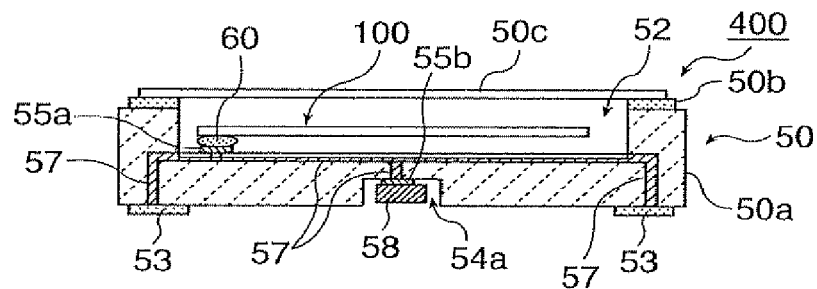
FIG. 18A is a cross-sectional view showing an electronic device according to an embodiment.

FIG. 18A is a cross-sectional view of an electronic device 400 according to an embodiment of the invention. The electronic device 400 mainly includes the piezoelectric vibration element 100 according to an embodiment of the invention (although the piezoelectric vibration element 100 is shown in FIG. 21A, another piezoelectric vibration element according to an embodiment of the invention may be used), a thermistor 58 that is a thermo-sensor, and a package 50 that houses the piezoelectric vibration element 100 and the thermistor 58. The package 50 includes a package main body 50a and a lid member 50c. In the package main body 50a, a cavity 52 that houses the piezoelectric vibration element 100 is formed on the upper face side, and a concave portion 54a that houses the thermistor 58 is formed on the lower face side. In addition, a plurality of element mounting pads 55a is disposed in the end portion of the bottom inside the cavity 52, and each one of the element mounting pads 55a is conducted and connected to a plurality of mounting terminals 53 through an internal conduction body 57. The piezoelectric vibration element 100 is placed at the element mounting pad 55a, and each pad 24 and each element mounting pad 55a are electrically connected and fixed to each other through a conductive adhesive 60. On the upper portion of the package main body 50a, a sealing ring 50b formed from Kovar or the like is calcined, and a lid member 50c is placed at the sealing ring 50b and is welded by using a resistance welder, and the cavity 52 is sealed in an airtight manner. The inside of the cavity 52 may be formed to be vacuum, or inert gas may be sealed therein.

On the other hand, at the center of the package main body 50a on the lower face side, the concave portion 54a is formed, and an electronic component mounting pad 55b is calcined on the upper face of the concave portion 54a. The thermistor 58 is mounted in the electronic component mounting pad 55b by using solder or the like. The electronic component mounting pad 55b is conducted and connected to a plurality of mounting terminals 53 through the internal conduction body 57.

Figure 18B:
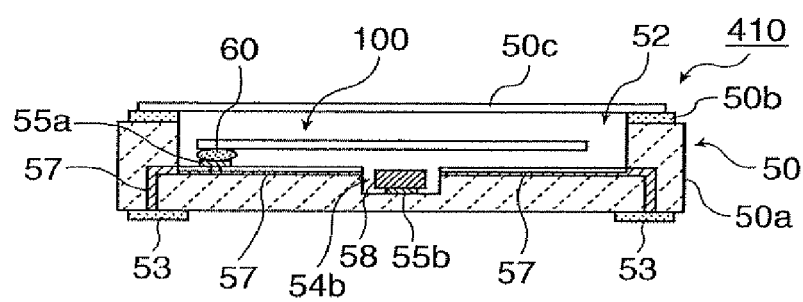
FIG. 18B is a cross-sectional view showing a modified example.

FIG. 18B is an electronic device 410 of a modified example of FIG. 18A. The electronic device 410 is different from the electronic device 400 that a concave portion 54b is formed on the bottom of the cavity 52 of the package main body 50a, and a thermistor 58 is configured so as to be connected to an electronic component mounting pad 55b formed by being calcined on the bottom of the concave portion 54b through a metal bump or the like. The electronic component mounting pad 55b is conductive to the mounting terminal 53. In other words, the piezoelectric vibration element 100 and the thermistor 58 as a thermo-sensor are housed inside the cavity 52 and are sealed in an airtight manner.

As above, while an example has been described in which the piezoelectric vibration element 100 and the thermistor 58 are housed inside the package 50, as electronic components housed inside the package 50, it is preferable to configure an electronic device housing at least one of a thermistor, a capacitor, a reactance element, and a semiconductor element.

The examples shown in FIGS. 18A and 18B are examples in which the piezoelectric vibration element 100 and the thermistor 58 are housed inside the package 50. By configuring as such, the thermistor 58 as a thermo-sensor is located near the piezoelectric vibration element 100, and accordingly, there is an advantage that a change in the temperature of the piezoelectric vibration element 100 can be sensed in a speedy manner. In addition, by configuring an electronic device by using the piezoelectric vibration element according to the embodiment of the invention and the above-described electronic component, an electronic device including the piezoelectric vibration element having low CI can be configured. Accordingly, there is an advantage that the electronic device can be used for a variety of uses.

In the package of the piezoelectric vibrator using the piezoelectric vibration element according to the embodiment of the invention, by assembling an IC component in which an oscillation circuit driving and amplifying the piezoelectric vibrator is mounted, a piezoelectric oscillator can be built.

Figure 19:
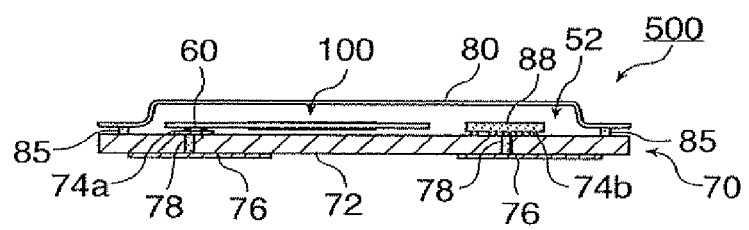
FIG. 19 is a cross-sectional view showing a piezoelectric oscillator according to an embodiment.

FIG. 19 is a cross-sectional view showing an example of a piezoelectric oscillator 500 according to the embodiment of the invention. The piezoelectric oscillator 500 mainly includes: the piezoelectric vibration element 100 (although the piezoelectric vibration element 100 is shown in FIG. 19, another piezoelectric vibration element according to the embodiment of the invention may be used); a single-layer insulating substrate 70; an IC (semiconductor element) 88 that drives the piezoelectric vibration element 100; and a convex-shaped lid member 80 that seals the front face space of the insulating substrate 70 including the piezoelectric vibration element 100 and an IC 88 in an airtight manner. In the insulating substrate 70, a plurality of element mounting pads 74a and electronic component mounting pads 74b used for mounting the piezoelectric vibration element 100 and the IC 88 are included on the front face, and mounting terminals 76 used for connections with external circuits are included on the rear face. The element mounting pad 74a, the electronic component mounting pad 74b and the mounting terminal 76 are conducted together through a conductor 78 that passes though the insulating substrate 70. In addition, the element mounting pad 74a and the electronic component mounting pad 74b are conducted through a conductor wiring (not shown) formed on the front face of the insulating substrate 70. After the IC 88 is mounted to the electronic component mounting pad 74b by using a metal bump or the like, the element mounting pad 74a is coated with a conductive adhesive 60, the pad 24 of the piezoelectric vibration element 100 is placed thereon, and the conductive adhesive 60 is cured for conduction and fixation inside a constant-temperature bath. The convex-shaped lid member 80 and the insulating substrate 70 are sealed in an airtight manner by low-melting-point glass 85 with which the peripheral edge of the upper face of the insulating substrate 70 is coated. At this time, by performing the sealing process in a vacuum atmosphere, the inside can be formed to be vacuum.

Figure 20A:
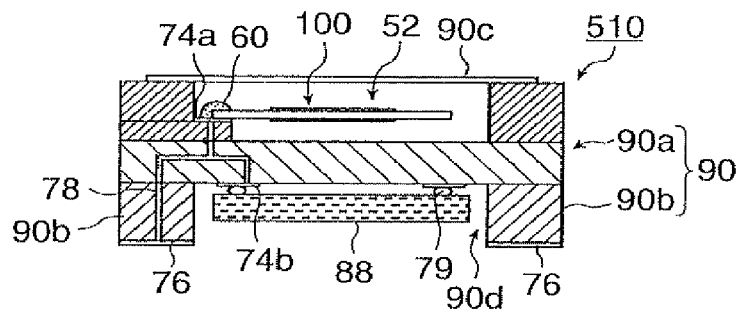
FIG. 20A is a cross-sectional view of a piezoelectric oscillator according to another embodiment.

FIG. 20A is a cross-sectional view of a piezoelectric oscillator 510 according to another embodiment of the invention. The piezoelectric oscillator 510 mainly includes: the piezoelectric vibration element 100 according to the embodiment of the invention; a package main body 90; an IC 88 that drives the piezoelectric vibration element 100; and a lid member 90c that seals the piezoelectric vibration element 100 in an airtight manner. The package main body 90 is a package main body having so-called H-type structure that is formed by an upper portion 90a having a cavity 52 that houses the piezoelectric vibration element 100 and a lower portion 90b having a concave portion 90d that houses an IC 88. The piezoelectric vibration element 100 is conducted and fixed by coating an element mounting pad 74a formed in the end portion of the bottom of the cavity 52 with a conductive adhesive 60, placing the piezoelectric vibration element 100 thereon, and thermally curing them. The IC 88 is connected and fixed to the electronic component mounting pad 74b formed on the upper face of a concave portion 90d on the lower face side of the package main body 90 through a metal bump 79. The element mounting pad 74a and the electronic component mounting pad 74b are conducted and connected through an internal conductor 78. The lid member 90c is placed in a seal ring (not shown) that is formed by being calcined on the upper portion of the package main body 90 and is welded by using a resistance welder or the like so as to be sealed in an airtight manner. The inside of the cavity 52 may be formed to be vacuum, or inert gas may be sealed therein.

Figure 20B:
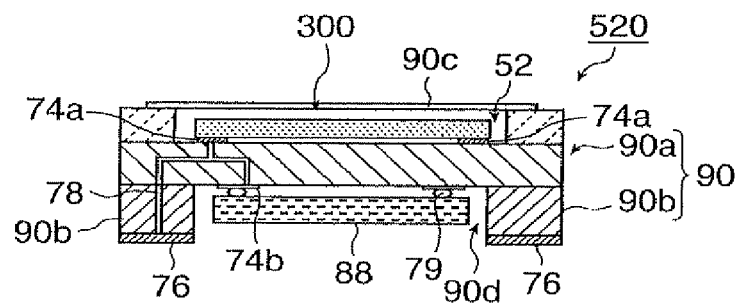
FIG. 20B is a cross-sectional view of a piezoelectric oscillator according to another embodiment.

FIG. 20B is a cross-sectional view of a piezoelectric oscillator 520 according to another embodiment of the invention. The piezoelectric oscillator 520 mainly includes: the piezoelectric vibrator 300 according to the embodiment of the invention; a package main body 90; an IC 88 that drives the piezoelectric vibrator 300; and a lid member 90c that seals the piezoelectric vibrator 300 in an airtight manner. The package main body 90 is a package main body having so-called H-type structure that is formed by an upper portion 90a having a cavity 52 that houses the piezoelectric vibrator 300 and a lower portion 90b having a concave portion 90d that houses an IC. The piezoelectric vibrator 300 is placed in element mounting pads 74a formed on both ends of the bottom of the cavity 52 and is fixed and connected through a solder or a metal bump. The IC 88 is connected and fixed to the element mounting pad 74b formed on the upper face of the concave portion 90d disposed on the lower face side of the package main body 90 by using the metal bump 79. The element mounting pad 74a and the electronic component mounting pad 74b are conducted through an internal conductor 78. The lid member 90c is placed in a seal ring (not shown) that is formed by being calcined on the upper portion of the package main body 90 and is welded by using a resistance welder. The piezoelectric vibration element is doubly sealed in an airtight manner.

The IC 88 may include an oscillation circuit that drives the piezoelectric vibrator 300, a thermo-sensor that senses the ambient temperature of the piezoelectric vibrator 300, a compensation circuit that compensates the frequency-temperature characteristic of the piezoelectric vibrator 300, and a voltage variable capacitance element, and the like.

Since the piezoelectric oscillator 500 according to an embodiment shown in FIG. 19 includes the piezoelectric vibration element 100, which has low CI, according to the embodiment of the invention and the IC (including an oscillation circuit) 88 inside the package, the piezoelectric oscillator can be miniaturized, and the oscillation current of the oscillation circuit can be configured to be low, whereby there is an advantage of achieving low power consumption.

Since the piezoelectric oscillator 510 according to an embodiment shown in FIG. 20A includes the piezoelectric vibration element 100, which has low CI, according to the embodiment of the invention and the IC (including an oscillation circuit) 88 inside the package, there is an advantage that low power consumption of the piezoelectric oscillator can be achieved. In addition, since the IC 88 can be externally adjusted, there is an advantage that a multi-functional piezoelectric oscillator having superior frequency-temperature characteristic can be configured.

In addition, since the piezoelectric oscillator 520 according to an embodiment shown in FIG. 20B uses the piezoelectric vibrator 300 housed inside the package, the frequency stability such as aging is superior, and there is an advantage that a multi-functional piezoelectric oscillator having reliability can be configured.

The invention is not limited to the above-described embodiments, and various changes may be made therein. For example, the invention includes a configuration (for example, a configuration having the same function, the same method, and the same result or a configuration having the same object and same effect) that is substantially the same as that described in the embodiment. In addition, the invention includes a configuration in which a portion of the configuration described in the embodiment that is not essential is replaced. Furthermore, the invention includes a configuration that can acquire the same effects as those of the configuration described in the embodiment or a configuration that can achieve the same object as that of the embodiment. In addition, the invention includes a configuration acquired by adding known technologies to the configuration described in the embodiment.

Furthermore, in the electronic device such as the above-described piezoelectric oscillator, although a configuration has been described in which an electronic component represented by the semiconductor element (IC) is configured to be included in the piezoelectric vibrator, it is preferable to include at least one or more electronic components. As the electronic component, a thermistor, a capacitor, a reactance element, and the like can be applied, and an electronic device using a piezoelectric vibrator element as an oscillation source can be built.

The entire disclosure of Japanese Patent Application No. 2011-060457, filed Mar. 18, 2011 is expressly incorporated by reference herein.

What is claimed is:

1. A piezoelectric vibration element comprising:
a piezoelectric substrate including (i) an excitation portion and (ii) a peripheral portion that is integrally arranged at a periphery of the excitation portion and whose thickness is smaller than that of the excitation portion; and
excitation electrodes that are arranged in a front-and-rear relationship on front and rear principal faces of the piezoelectric substrate;
the excitation portion including:
a first portion that is at a location of a maximum thickness of the excitation portion; and
a plurality of side faces that each are connected to (i) a principal face of the first portion and (ii) a principal face of the peripheral portion;
the plurality of side faces including:
side faces corresponding to level difference portions having a level difference; and
side faces corresponding to portions that have no level difference from the principal face of the first portion to the principal face of the peripheral portion, wherein
the level difference portions are arranged at two locations sandwiching the first portion therebetween, with the principal faces seen in plan view;
at least one face of the side faces corresponding to portions that have no level difference extends along a direction in which the two locations are aligned, and is connected to the level difference portions, and
the excitation electrodes are located at the first portion and the peripheral portion, extending over the level difference portions.

2. The piezoelectric vibration element according to claim 1, wherein:
when, by using an X axis of an orthogonal coordinate system as a rotation axis, the orthogonal coordinate system being formed from the X axis as an electrical axis, a Y axis as a mechanical axis, and a Z axis as an optical axis, which are crystal axes of a crystal,
an axis acquired by inclining the Z axis such that a +Z side is rotated in a −Y direction of the Y axis is set as a Z' axis,
an axis acquired by inclining the Y axis such that a +Y side is rotated in a +Z direction of the Z axis is set as a Y' axis, and
a plane including the X axis and the Z' axis is a principal face,
the piezoelectric substrate is a quartz crystal substrate that includes a pair of faces along the X axis and a pair of faces along the Z' axis and has a thickness in a direction along the Y' axis, and
the level difference portions extend along the Z' axis.

3. The piezoelectric vibration element according to claim 2, wherein:
the at least one face that has no level difference extends along the X axis.

4. The piezoelectric vibration element according to claim 2, further comprising:
a pad that is arranged at least at any of corner portions of the front and rear principal faces of the piezoelectric substrate, the pad having a support area at a position at which the piezoelectric substrate is fixed to a support member, wherein:

when a length of the piezoelectric substrate along the X axis is X, a thickness of the first portion along the Y' axis is t, and a length distance between (i) an end portion, among end portions of the support area, positioned at a side of the excitation electrodes and (ii) an end portion, among end portions of the excitation electrodes, positioned at a side of the pad is ΔX, a relationship of $14 \leq X/t \leq 18$ and $0.04$ mm$\leq \Delta X \leq 0.06$ mm is satisfied.

5. The piezoelectric vibration element according to claim 3, further comprising:
a pad that is arranged at least at any of corner portions of the front and rear principal faces of the piezoelectric substrate, the pad having a support area at a position at which the piezoelectric substrate is fixed to a support member, wherein:
when a length of the piezoelectric substrate along the X axis is X, a thickness of the first portion along the Y' axis is t, and a length distance between (i) an end portion, among end portions of the support area, positioned at a side of the excitation electrodes and (ii) an end portion, among end portions of the excitation electrodes, positioned at a side of the pad is ΔX, a relationship of $14 \leq X/t \leq 18$ and $0.04$ mm$\leq \Delta X \leq 0.06$ mm is satisfied.

6. The piezoelectric vibration element according to claim 2, wherein:
when a length of the piezoelectric substrate along the Z' axis is Z, a length of the excitation portion along the Z' axis is Mz, and a thickness of the first portion along the Y' axis is t, a relationship of $8 \leq Z/t \leq 11$ and $0.6 \leq Mz/Z \leq 0.8$ is satisfied.

7. The piezoelectric vibration element according to claim 3, wherein:
when a length of the piezoelectric substrate along the Z' axis is Z, a length of the excitation portion along the Z' axis is Mz, and a thickness of the first portion along the Y' axis is t, a relationship of $8 \leq Z/t \leq 11$ and $0.6 \leq Mz/Z \leq 0.8$ is satisfied.

8. The piezoelectric vibration element according to claim 4, wherein:
when a length of the piezoelectric substrate along the Z' axis is Z, a length of the excitation portion along the Z' axis is Mz, and a thickness of the first portion along the Y' axis is t, a relationship of $8 \leq Z/t \leq 11$ and $0.6 \leq Mz/Z \leq 0.8$ is satisfied.

9. The piezoelectric vibration element according to claim 5, wherein:
when a length of the piezoelectric substrate along the Z' axis is Z, a length of the excitation portion along the Z' axis is Mz, and a thickness of the first portion along the Y' axis is t, a relationship of $8 \leq Z/t \leq 11$ and $0.6 \leq Mz/Z \leq 0.8$ is satisfied.

10. A piezoelectric vibrator comprising:
the piezoelectric vibration element according to claim 1, and:
a package that houses the piezoelectric vibration element.

11. A piezoelectric vibrator comprising:
the piezoelectric vibration element according to claim 2, and:
a package that houses the piezoelectric vibration element.

12. A piezoelectric oscillator comprising:
the piezoelectric vibration element according to claim 1; and
an oscillation circuit that drives the piezoelectric vibration element.

13. A piezoelectric oscillator comprising:
the piezoelectric vibration element according to claim 2; and
an oscillation circuit that drives the piezoelectric vibration element.

14. The piezoelectric oscillator according to claim 12, wherein:
the oscillation circuit is built in to an integrated circuit.

15. The piezoelectric oscillator according to claim 13, wherein:
the oscillation circuit is built in to an integrated circuit.

16. An electronic device, comprising:
the piezoelectric vibration element according to claim 1; and
one or more electronic components.

17. An electronic device, comprising:
the piezoelectric vibration element according to claim 2; and
one or more electronic components.

18. The electronic device according to claim 16, wherein:
the electronic component is any of a thermistor, a capacitor, a reactance element, or a semiconductor element.

19. The electronic device according to claim 17, wherein:
the electronic component is any of a thermistor, a capacitor, a reactance element, or a semiconductor element.

* * * * *